US008908872B2

(12) United States Patent
Hanna

(10) Patent No.: US 8,908,872 B2
(45) **Date of Patent: *Dec. 9, 2014**

(54) BTSC ENCODER

(75) Inventor: Christopher M. Hanna, Arlington, MA (US)

(73) Assignee: THAT Corporation, Milford, MA (US)

( * ) Notice: Subject to any disclaimer, the term of this patent is extended or adjusted under 35 U.S.C. 154(b) by 1196 days.

This patent is subject to a terminal disclaimer.

(21) Appl. No.: 11/445,670

(22) Filed: Jun. 2, 2006

(65) Prior Publication Data

US 2007/0016316 A1 Jan. 18, 2007

Related U.S. Application Data

(60) Division of application No. 09/638,245, filed on Aug. 14, 2000, now abandoned, which is a continuation of application No. 09/041,244, filed on Mar. 12, 1998, now Pat. No. 6,118,879, which is a division of application No. 08/661,412, filed on Jun. 7, 1996, now Pat. No. 5,796,842.

(51) Int. Cl.

| | |
|---|---|
| ***H04R 1/40*** | (2006.01) |
| ***H03G 7/00*** | (2006.01) |
| ***H04H 20/47*** | (2008.01) |
| ***H04H 20/88*** | (2008.01) |
| ***H04H 40/36*** | (2008.01) |
| ***H04S 5/02*** | (2006.01) |
| ***G10L 19/008*** | (2013.01) |

(52) U.S. Cl.

CPC ................. *H04S 5/02* (2013.01); *G10L 19/008* (2013.01)

USPC .................................. 381/2; 381/106; 381/97

(58) Field of Classification Search

CPC ....... H04H 20/88; H04H 20/95; H04H 20/86; H04H 20/44; H04H 20/46; H04H 20/47; H04H 20/48; H04H 5/607; H04H 5/602

USPC .......... 381/1, 2, 4, 106, 107, 317, 97; 700/94; 348/480–485, 738

See application file for complete search history.

(56) References Cited

U.S. PATENT DOCUMENTS 3,757,047 A 9/1973 Ito et al.
3,761,628 A 9/1973 Bauer (Continued)

FOREIGN PATENT DOCUMENTS

DE 4417993 12/1995
EP 0273567 7/1998

(Continued)

OTHER PUBLICATIONS

Rashid, M. H., "SPICE for Circuits and Electronics Using PSpice", Prentice Hall, Englewood Cliffs, NJ, 1990.

(Continued)

*Primary Examiner* — Ping Lee

(74) *Attorney, Agent, or Firm* — McDermott Will & Emery LLP

(57) ABSTRACT

The disclosed BTSC encoder includes a left high pass filter means for receiving a digital left channel audio signal and for digitally high pass filtering the digital left channel audio signal and thereby generating a digital left filtered signal; a right high pass filter means for receiving a digital right channel audio signal and for digitally high pass filtering the digital right channel audio signal and thereby generating a digital right filtered signal; a matrix means for receiving the digital left and digital right filtered signals, and including means for summing the digital left and digital right filtered signals and thereby generating a digital sum signal, and including means for subtracting one of the digital left and digital right filtered signals from the other of the digital left and digital right filtered signals and thereby generating a digital difference signal; a difference channel processing means for digitally processing the digital difference signal; and a sum channel processing means for digitally processing the digital sum signal.

10 Claims, 10 Drawing Sheets

200

(56) References Cited

U.S. PATENT DOCUMENTS

| | | | | |
|---|---|---|---|---|
| 4,048,654 | A | 9/1977 | Wegner | |
| 4,139,866 | A | 2/1979 | Wegner | |
| 4,405,944 | A | 9/1983 | Eilers et al. | |
| 4,425,665 | A | 1/1984 | Stauffer | 375/9 |
| 4,539,526 | A | 9/1985 | Davis | |
| 4,602,380 | A | 7/1986 | Stebbings | |
| 4,712,240 | A | 12/1987 | Schnerk | |
| 4,747,140 | A | 5/1988 | Gibson | |
| 4,757,467 | A | 7/1988 | Dietrich et al. | 364/752 |
| 4,760,602 | A * | 7/1988 | Gibson et al. | 381/106 |
| 4,803,727 | A | 2/1989 | Holt et al. | |
| 4,809,274 | A | 2/1989 | Walker et al. | |
| 4,823,298 | A | 4/1989 | Wu et al. | 364/735 |
| 4,939,782 | A * | 7/1990 | Gambacurta et al. | 381/103 |
| 4,947,361 | A | 8/1990 | Smith | |
| 5,023,609 | A | 6/1991 | Reich | 341/50 |
| 5,054,070 | A | 10/1991 | Eckstein et al. | |
| 5,222,144 | A * | 6/1993 | Whikehart | 381/15 |
| 5,239,543 | A | 8/1993 | Janssens | |
| 5,278,909 | A | 1/1994 | Edgar | |
| 5,282,019 | A | 1/1994 | Basile et al. | |
| 5,301,255 | A | 4/1994 | Nagai et al. | |
| 5,307,302 | A | 4/1994 | Nakano | |
| 5,337,196 | A | 8/1994 | Kim | |
| 5,341,321 | A | 8/1994 | Karp et al. | |
| 5,357,284 | A | 10/1994 | Todd | |
| 5,390,213 | A | 2/1995 | O'Donnell | |
| 5,610,985 | A | 3/1997 | Kate et al. | |
| 5,631,968 | A | 5/1997 | Frey et al. | |
| 5,633,936 | A * | 5/1997 | Oh | 381/66 |
| 5,682,431 | A * | 10/1997 | Ohnishi et al. | 381/2 |
| 5,732,106 | A | 3/1998 | Rasmussen et al. | 375/296 |
| 5,796,842 | A | 8/1998 | Hanna | |
| 5,873,065 | A | 2/1999 | Akagiri et al. | |
| 5,909,460 | A | 6/1999 | Dent | |
| 6,006,108 | A | 12/1999 | Black et al. | |
| 6,037,993 | A | 3/2000 | Easley | 348/485 |
| 6,118,879 | A | 9/2000 | Hanna | |
| 6,259,482 | B1 | 7/2001 | Easley et al. | 348/485 |
| 6,434,246 | B1 * | 8/2002 | Kates et al. | 381/317 |

FOREIGN PATENT DOCUMENTS

| | | | |
|---|---|---|---|
| EP | 0571005 | B1 | 6/1999 |
| EP | 0974211 | A1 | 1/2000 |
| GB | 0970051 | A | 9/1964 |
| GB | 2134357 | | 1/1984 |
| JP | 04-163497 | A1 | 6/1992 |
| JP | 04-177300 | A1 | 6/1992 |
| JP | 5218992 | | 8/1993 |
| JP | 06-090209 | A1 | 3/1994 |
| JP | 07-160292 | A1 | 6/1995 |
| WO | 92/22060 | A1 | 12/1992 |
| WO | 95/16333 | A1 | 6/1995 |
| WO | 9747102 | A1 | 12/1997 |

OTHER PUBLICATIONS

Moriya, T. et al., "Digital Transmission System for Stereo Broadcasting", Fujitsu Sci. & Tech. J., vol. 15, No. 4, 1-19, 12/79.

FCC, Multichannel Television Sound Transmission and Audio Processing Requirements for the BTSC System, OET Bulletin No. 60, Revision A, Feb. 1986.

Anonymous, "Multi-Channel TV Sound System BTSC System Recommended Practices; CEA TVSB5" CEA Standard, Jul. 1985 XP 017001201 p. 9; Figure 1.2.2 p. 53-54, paragraph 2.4.1.1.

Randy Hoffner, "Multichannel Television Sound Broadcasting in the United States", J. Audio Eng. Soc. vol. 35, No. 9:660-665 Sep. 1987.

Supplementary European Search Report for EP 97927918 (entitled "BTSC Encoder"), 2 pages.

Todd C. et al. "A Compatible Digital Audio Format for Broadcast and Cable Television," IEEE Transactions on Consumer Electronics, vol. CE-33, No. 3, Aug. 1987.

Tyler L. B. et al. "A Companding System for Multichannel TV Sound," IEEE Transactions on Consumer Electronics, vol. CE-30, No. 4:633-640, Nov. 1984.

Electronic Industries Association, Multichannel Television Sound BTSC System Recommended Practices, EIA Television System Bulletin No. 5, Jul. 1985.

Raz, et al,, Session VII—Audio Signal Processing, 1986 IEEE International Conference on Consumer Electronics, pp. 98-99.

Anonymous: "Multi-Channel TV Sound System BTSC System Recommended Practices; CEA TVSB5", CEA Standard, Jul. 1985, XP017001201, p. 9; figure 1.2.2; pp. 53-54, paragraph 2.4.1.1.

Morris, R. E., et al.: "A New Audio Processor IC for the BTSC System", Proceedings of the International Conference of Consumer Electronics (ICCE), Rosemont, Ill., Jun. 6-8, 1990, New York, IEEE, US, vol. CONF. 9, Jun. 6, 1990, pp. 298-299, XP000169919, p. 299.

Raz, Z. et al.: "A Digital Signal Processing Approach to Multichannel Television Sound Decoding", IEEE Transactions on Consumer Electronics, IEEE Service Center, New York, NY, US, vol. CE-32, No. 3, Aug. 1986, pp. 453-461, XP002071916, ISSN: 0098-3063, p. 453, p. 456.

Multichannel Television Sound Transmission and Audio Processing Requirements for the BTSC System, Office of Engineering and Technology, Authorization and Evaluation Division, Federal Communication Commission, OET Bulletin No. 60 (1986).

Crochiere et al., "Interpolation and Decimation of Digital Signals—A Tutorial Review", Proceedings of the IEEE, vol. 69, No. 3, Mar. 1981, 32 pages (300-331).

Office Action, dated Sep. 1, 2011, for Chinese Patent Application No. 200710192872.2 (based on PCT/US97/09493, filed Jun. 2, 1997, claiming priority from U.S. Appl. No. 08/661,412, filed Jun. 7, 1996), entitled "BTSC Encoder," THAT Corporation, Applicant; Christopher M. Hanna, Inventor (partial translation and original).

Applicant's Admitted Prior Art: Figure 1 of the Instant Application, filed Jun. 2, 2006, which is a block diagram of a prior art BTSC encoding system.

Eilers, C.G., 1984. TV Multichannel Sound—The BTSC System. In Consumer Electronics, IEEE Transactions on, Aug. 1984, vol. CD-30, No. 3, pp. 236-241.

Farmer, J.O. et al. 1987. Cable and BTSC Stereo. In IEEE Transactions on Consumer Electronics, Feb. 1987, vol. CE-33, No. 1, pp. 30-38.

Gibson, J.J. 1986. Effects of Receiver Design and Transmission Impairments on Audio Signal Quality in the BTSC System for Multichannel Television Sound. In Proceedings of the 4th International AES Conference, Stereo Audio Technology for Television and Video, May 1986.

Kuehn, H.J. et al. 1988. Single-chip BTSC Multi-channel TV Sound Decoder. IEEE Transactions on Consumer Electronics, Aug. 1988, vol. 34, No. 3, pp. 620-624. ISSN: 00983063; DOI: 10.1109/3010162; Conference: 1988 International Conference on Consumer Electronics, Part 1.; Sponsor: IEEE, Consumer Electronics Soc, New York, NY, USA.

Martin, T.F. 1986. Compatibility Between Baseband Converters and MTS Stereo. In Technical Papers—NCTA Annual Convention (National Cable Television Association), pp. 5-9.

Motoyama, T. 1989. Method and Apparatus for Detecting a Desired MTS Signal in a Television Receiver. IEEE Transactions on Consumer Electronics, Aug. 1989, vol. 35, No. 3, pp. 487-492. ISSN: 00983063; DOI: 10.1109/30.44308; Conference: International Conference on Consumer Electronics 1989, Part 1 (of 2), Jun. 6-9, 1989.

Numaguchi, Y. et al.. 1981. Multichannel Sound System for Television Broadcasting. IEEE Transactions on Consumer Electronics, vol. CE-27, No. 3, Aug. 1981; ISSN: 00983063; Conference: Spring Conf, Jun. 1, 1981, pp. 366-371.

Reich, W. 1988. BTSC TV Multichannel Sound Decoder Including Digital Expander. IEEE Transactions on Consumer Electronics, Aug. 1988, vol. 34, No. 3, pp. 634-641. ISSN: 00983063; DOI: 10.1109/30.20164; Conference: 1988 International Conference on Consumer Electronics, Part 1.; Sponsor: IEEE, Consumer Electronics Soc, New York, NY, USA.

(56) References Cited

OTHER PUBLICATIONS

Salisbury, R.A., Editor. 1987. MTS The Michigan Terminal System vol. 2: Public File Descriptions Jan. 1987, Jan. 1, 1987 UTC United States English (United States), Previously published in the SPI Database of Software Technologies, Loaded into the IP.com Prior Art Database on (Sep. 19, 2005 UTC). 381 pages.

Voldby, J. 1987. "Digital Synthesis of High Quality Test Signal Conforming to the BTSC TV Stereo System." IEEE Transactions on Consumer Electronics, vol. CE-33, No. 3, Aug. 1987, pp. 306-311.

Office Action, dated Dec. 23, 2011 for U.S. Appl. No. 13/108,076, filed May 16, 2011, entitled "BTSC Encoder," Christopher M. Hanna, inventor.

Office Action, dated Mar. 1, 2012, for U.S. Appl. No. 13/324,566, filed Dec. 13, 2011, entitled "BTSC Encoder," Christopher M. Hanna, inventor.

Office Action, dated Mar. 12, 2012, for U.S. Appl. No. 13/329,516, filed Dec. 19, 2011, entitled "BTSC Encoder," Christopher M. Hanna, inventor.

Office Action, dated Apr. 27, 2012 for Japanese Patent Application 2008-127500, entitled "BTSC Encoder," Christopher M. Hanna, inventor (with translation).

Office Action, dated Apr. 27, 2012 for Japanese Patent Application 2008-127501, entitled "BTSC Encoder," Christopher M. Hanna, inventor (with translation).

Office Action, dated Apr. 27, 2012 for Japanese Patent Application 2008-127502, entitled "BTSC Encoder," Christopher M. Hanna, inventor (with translation).

Office Action, dated Jun. 11, 2012, for U.S. Appl. No. 13/011,396, filed Jan. 21, 2011, entitled "BTSC Techniques," Christopher M. Hanna, inventor.

Office Action, dated Jun. 12, 2012, for U.S. Appl. No. 13/172,116, filed Jun. 29, 2011, entitled "BTSC Encoder," Christopher M. Hanna, inventor.

Notice of Allowance, dated Jun. 22, 2012, for U.S. Appl. No. 11/927,751, filed Oct. 30, 2007, entitled "BTSC Encoder," Christopher M. Hanna, inventor.

Office Action, dated Jun. 26, 2012, for U.S. Appl. No. 11/930,241, filed Oct. 31, 2007, entitled "BTSC Encoder," Christopher M. Hanna, inventor.

Office Action, dated Jun. 29, 2012, for U.S. Appl. No. 11/927,742, filed Oct. 30, 2007, entitled "BTSC Encoder," Christopher M. Hanna, inventor.

Office Action, dated Jun. 29, 2012, for U.S. Appl. No. 13/032,528, filed Feb. 22, 2011, entitled "BTSC Encoder," Christopher M. Hanna, inventor.

Office Action, dated Jul. 2, 2012, for U.S. Appl. No. 11/927,746, filed Oct. 30, 2007, entitled "BTSC Encoder," Christopher M. Hanna, inventor.

Fukui, S. 1994. Audio Alchemizer, Digital Dynamic Equalizer. Radio-Craft Monthly (Japanese monthly magazine for audiophiles), Oct. 1, 1994, vol. 48, No. 10, pp. 109-114. (In Japanese. Cited in a Japanese Decision on Appeal, dated Jan. 31, 2011, Japanese Application No. 200762/1998; Partial translation also submitted.).

* cited by examiner

BTSC ENCODER

RELATED APPLICATIONS

This application is a divisional of prior U.S. application Ser. No. 09/638,245, filed 14 Aug. 2000 now abandoned, which is a continuation of prior U.S. application Ser. No. 09/041,244, filed 12 Mar. 1998 now U.S. Pat. No. 6,118,879, which is a divisional of prior U.S. application Ser. No. 08/661,412, filed 7 Jun. 1996 now U.S. Pat. No. 5,796,842, all of which applications are incorporated herein in their entireties by reference.

FIELD OF THE INVENTION

The present invention relates generally to stereophonic audio encoders used for television broadcasting. More particularly, the invention relates to a digital encoder for generating the audio signals used in the broadcast of stereophonic television signals in the United States and in other countries.

BACKGROUND OF THE INVENTION

In the 1980's, the United States Federal Communications Commission (FCC) adopted new regulations covering the audio portion of television signals which permitted television programs to be broadcast and received with bichannel audio, e.g., stereophonic sound. In those regulations, the FCC recognized and gave special protection to a method of broadcasting additional audio channels endorsed by the Electronic Industries Association and the National Association of Broadcasters and called the Broadcast Television Systems Committee (BTSC) system. This well-known standard is sometimes referred to as Multichannel Television Sound (MTS) and is described in the FCC document entitled, MULTICHANNEL TELEVISION SOUND TRANSMISSION AND AUDIO PROCESSING REQUIREMENTS FOR THE BTSC SYSTEM (OET Bulletin No. 60, Revision A, February 1986), as well as in the document published by the Electronic Industries Association entitled, MULTICHANNEL TELEVISION SOUND BTSC SYSTEM RECOMMENDED PRACTICES (EIA Television Systems Bulletin No. 5, July 1985). Television signals generated according to the BTSC standard are referred to hereinafter as "BTSC signals".

The original monophonic television signals carried only a single channel of audio. Due to the configuration of the monophonic television signal and the need to maintain compatibility with existing television sets, the stereophonic information was necessarily located in a higher frequency region of the BTSC signal making the stereophonic channel much noisier than the monophonic audio channel. This resulted in an inherently higher noise floor for the stereo signal than for the monophonic signal. The BTSC standard overcame this problem by defining an encoding system that provided additional signal processing for the stereophonic audio signal. Prior to broadcast of a BTSC signal by a television station, the audio portion of a television program is encoded in the manner prescribed by the BTSC standard, and upon reception of a BTSC signal a receiver (e.g., a television set) then decodes the audio portion in a complementary manner. This complementary encoding and decoding insures that the signal-to-noise ratio of the entire stereo audio signal is maintained at acceptable levels.

FIG. 1 is a block diagram of a prior art BTSC encoding system, or more simply, a BTSC encoder 100, as defined by the BTSC standard. Encoder 100 receives left and right channel audio input signals (indicated in FIG. 1 as "L" and "R", respectively) and generates therefrom a conditioned sum signal and an encoded difference signal. It should be appreciated that while the system of the prior art and that of the present invention is described as useful for encoding the left and right audio signals of a stereophonic signal that is subsequently transmitted as a television signal, the BTSC system also provides means to encode a separate audio signal, e.g., audio information in a different language, which is separated and selected by the end receiver. Further, noise reduction components of the BTSC encoding system can be used for other purposes besides television broadcast, such as for improving audio recordings.

System 100 includes an input section 110, a sum channel processing section 120, and a difference channel processing section 130. Input section 110 receives the left and right channel audio input signals and generates therefrom a sum signal (indicated in FIG. 1 as "L+R") and a difference signal (indicated in FIG. 1 as "L−R"). It is well known that for stereophonic signals, the sum signal L+R may be used by itself to provide monophonic audio reproduction and it is this signal that is decoded by existing monophonic audio television sets to reproduce sound. In stereophonic sets, the sum and difference signals can be added to and subtracted from one another to recover the original two stereophonic signals (L) and (R). Input section 110 includes two signal adders 112, 114. Adder 112 sums the left and right channel audio input signals to generate the sum signal, and adder 114 subtracts the right channel audio input signal from the left channel audio input signal to generate the difference signal. As described above, the sum signal L+R is transmitted through a transmission media with the same signal to noise ratio as achieved with the prior monophonic signals. However, the difference signal L−R is transmitted though a very noisy channel, particularly at the higher frequency portion of the relevant spectrum so that the decoded difference signal has a poorer signal-to-noise ratio because of the noisy medium and reduced dynamic range of the medium. The dynamic range is defined as the range of signals between the level of the noise floor and the maximum level where signal saturation occurs. In the difference signal channel the dynamic range decreases at higher frequencies. Accordingly, the difference signal is subjected to additional processing than that of the sum signal so that the dynamic range can be substantially preserved.

More particularly, the sum channel processing section 120 receives the sum signal and generates therefrom the conditioned sum signal. Section 120 includes a 75 μs preemphasis filter 122 and a bandlimiter 124. The sum signal is applied to the input of filter 122 which generates therefrom an output signal that is applied to the input of bandlimiter 124. The output signal generated by the latter. is then the conditioned sum signal.

The difference channel processing section 130 receives the difference signal and generates therefrom the encoded difference signal. Section 130 includes a fixed preemphasis filter 132 (shown implemented as a cascade of two filters 132*a* and 132*b*), a variable gain amplifier 134 preferably in the form of a voltage-controlled amplifier, a variable preemphasis/deemphasis filter (referred to hereinafter as a "variable emphasis filter") 136, an overmodulation protector and bandlimiter 138, a fixed gain amplifier 140, a bandpass filter 142, an RMS level detector 144, a fixed gain amplifier 146, a bandpass filter 148, an RMS level detector 150, and a reciprocal generator 152.

The difference signal is applied to the input of fixed preemphasis filter 132 which generates therefrom an output signal that is applied via line 132*d* to an input terminal of amplifier 134. An output signal generated by reciprocal generator 152 is applied via line 152*a* to a gain control terminal of amplifier 134. Amplifier 134 generates an output signal by amplifying the signal on line 132*d* using a gain that is proportional to the value of the signal on line 152*a*. The output signal generated by amplifier 134 is applied via line 134*a* to an input terminal of variable emphasis filter 136, and an output signal generated by RMS detector 144 is applied via line 144*a* to a control terminal of filter 136. Variable emphasis filter 136 generates an output signal by preemphasizing or deemphasizing the high frequency portions of the signal on line 134*a* under the control of the signal on line 144*a*. The output signal generated by filter 136 is applied to the input of overmodulation protector and bandlimiter 138 which generates therefrom the encoded difference signal.

The encoded difference signal is applied via feedback path 138*a* to the inputs of fixed gain amplifiers 140, 146, which amplify the encoded difference signal by Gain A and Gain B, respectively. The amplified signal generated by amplifier 140 is applied to an input of bandpass filter 142 which generates therefrom an output signal that is applied to the input of RMS level detector 144. The latter generates an output signal as a function of the RMS value of the input signal level received from filter 142. The amplified signal generated by amplifier 146 is applied to the input of bandpass filter 148 which generates therefrom an output signal that is applied to the input of RMS level detector 150. The latter generates an output signal as a function of the RMS value of the input signal level received from filter 148. The output signal of detector 150 is applied via line 150*a* to reciprocal generator 152, which generates a signal on line 152*a* that is representative of the reciprocal of the value of the signal on line 150*a*. As stated above, the output signals generated by RMS level detector 144 and reciprocal generator 152 are applied to filter 136 and amplifier 134, respectively.

As shown in FIG. 1, the difference channel processing section 130 is considerably more complex than the sum channel processing section 120. The additional processing provided by the difference channel processing section 130, in combination with complementary processing provided by a decoder (not shown) receiving a BTSC signal, maintains the signal-to-noise ratio of the difference channel at acceptable levels even in the presence of the higher noise floor associated with the transmission and reception of the difference channel. Difference channel processing section 130 essentially generates the encoded difference signal by dynamically compressing, or reducing the dynamic range of the difference signal so that the encoded signal may be transmitted through the limited dynamic range transmission path associated with a BTSC signal, and so that a decoder receiving the encoded signal may recover all the dynamic range in the original difference signal by expanding the compressed difference signal in a complementary fashion. The difference channel processing section 130 is a particular form of the adaptive signal weighing system described in U.S. Pat. No. 4,539,526, which is known to be advantageous for transmitting a signal having a relatively large dynamic range through a transmission path having a relatively narrow, frequency dependent, dynamic range.

Briefly, the difference channel processing section may be thought of as including a wide band compression unit 180 and a spectral compression unit 190. The wide band compression unit 180 includes variable gain amplifier 134 preferably in the form of a voltage controlled amplifier, and the components of the feedback path for generating the control signal to amplifier 134 and comprising amplifier 146, band pass filter 148, RMS level detector 150, and reciprocal generator 152. Band pass filter 148 has a relatively wide pass band, weighted towards lower audio frequencies, so in operation the output signal generated by filter 148 and applied to RMS level detector 150 is substantially representative of the encoded difference signal. RMS level detector 150 therefore generates an output signal on line 150*a* representative of a weighted average of the energy level of the encoded difference signal, and reciprocal generator 152 generates a signal on line 152*a* representative of the reciprocal of this weighted average. The signal on line 152*a* controls the gain of amplifier 134, and since this gain is inversely proportional to a weighted average (i.e., weighted towards lower audio frequencies) of the energy level of the encoded difference signal, wide band compression unit 180 "compresses", or reduces the dynamic range, of the signal on line 132*a* by amplifying signals having relatively low amplitudes and attenuating signals having relatively large amplitudes.

The spectral compression unit 190 includes variable emphasis filter 136 and the components of the feedback path generating a control signal to the filter 136 and comprising amplifier 140, band pass filter 142 and RMS level detector 144. Unlike filter 148, band pass filter 142 has a relatively narrow pass band that is weighted towards higher audio frequencies. As is well known, the transmission medium associated with the difference portion of the BTSC transmission system has a frequency dependent dynamic range and the pass band of filter 142 is chosen to correspond to the spectral portion of that transmission path having the narrowest dynamic range (i.e., the higher frequency portion). In operation the output signal generated by filter 142 and applied to RMS level detector 144 contains primarily the high frequency portions of the encoded difference signal. RMS level detector 144 therefore generates an output signal on line 144*a* representative of the energy level in the high frequency portions of the encoded difference signal. This signal then controls the preemphasis/deemphasis applied by variable emphasis filter 136 so in effect the spectral compression unit 190 dynamically compresses high frequency portions of the signal on line 134*a* by an amount determined by the energy level in the high frequency portions of the encoded difference signal as determined by the filter 142. The use of the spectral compression unit 190 thus provides additional signal compression towards the higher frequency portions of the difference signal, which combines with the wideband compression provided by the variable gain amplifier 134 to effectively cause more overall compression to take place at high frequencies relative to the compression at lower frequencies. This is done because the difference signal tends to be noisier in the higher frequency part of the spectrum. When the encoded difference signal is decoded with a wideband expander and a spectral expander in a decoder (not shown), respectively in a complementary manner to the wide band compression unit 180 and spectral compression unit 190 of the encoder, the signal-to-noise ratio of the L−R signal applied to the difference channel processing section 130 will be substantially preserved.

The BTSC standard rigorously defines the desired operation of the 75 μs preemphasis filter 122, the fixed preemphasis filter 132, the variable emphasis filter 136, and the bandpass filters 142, 148, in terms of idealized analog filters. Specifically, the BTSC standard provides a transfer function for each of these components and the transfer functions are described in terms of mathematical representations of idealized analog filters. The BTSC standard also defines the gain settings, Gain A and Gain B, of amplifiers 140 and 146, respectively, and also defines the operation of amplifier 134, RMS level detectors 144, 150, and reciprocal generator 152. The BTSC standard also provides suggested guidelines for the operation of overmodulation protector and bandlimiter 138 and bandlimiter 124. Specifically, bandlimiter 124 and the bandlimiter portion of overmodulation protector and bandlimiter 138 are described as low pass filters with cutoff frequencies of 15 kHz, and the overmodulation protection portion of overmodulation protector and bandlimiter 138 is described as a threshold device that limits the amplitude of the encoded difference signal to 100% of full modulation where full modulation is the maximum permissible deviation level for modulating the audio subcarrier in a television signal.

Since encoder 100 is defined in terms of mathematical descriptions of idealized filters it may be thought of as an idealized or theoretical encoder, and those skilled in the art will appreciate that it is virtually impossible to construct a physical realization of a BTSC encoder that exactly matches the performance of theoretical encoder 100. Therefore, it is expected that the performance of all BTSC encoders will deviate somewhat from the theoretical ideal, and the BTSC standard defines maximum limits on the acceptable amounts of deviation. For example, the BTSC standard states that a BTSC encoder must provide at least 30 db of separation. from 100 Hz to 8,000 Hz where separation is a measure of how much a signal applied to only one of the left or right channel's inputs appears erroneously in the other of the left or right channel's outputs.

The BTSC standard also defines a composite stereophonic baseband signal (referred to hereinafter as the "composite signal") that is used to generate the audio portion of a BTSC signal. The composite signal is generated using the conditioned sum signal, the encoded difference signal, and a tone signal, commonly referred to as the "pilot tone" or simply as the "pilot", which is a sine wave at a frequency $f_H$ where $f_H$ is equal to 15,734 Hz. The presence of the pilot in a received television signal indicates to the receiver that the television signal is a BTSC signal rather than a monophonic or other non-BTSC signal. The composite signal is generated by multiplying the encoded difference signal by a waveform that oscillates at twice the pilot frequency according to the cosine function $\cos(4\pi f_H t)$, where t is time, to generate an amplitude modulated, double-sideband, suppressed carrier signal and by then adding to this signal the conditioned sum signal and the pilot tone.

FIG. 2 is a graph of the spectrum of the composite signal. In FIG. 2 the spectral band of interest containing the content of the conditioned sum signal (or the "sum channel signal") is indicated as "L+R", the two spectral sidebands containing the content of the frequency shifted encoded difference signal (or the "difference channel signal") are each indicated as "L−R", and the pilot tone is indicated by the arrow at frequency $f_H$. As shown in FIG. 2, in the composite signal the encoded difference signal is used at 100% of full modulation, the conditioned sum signal is used at 50% of full modulation, and the pilot tone is used at 10% of full modulation.

Stereophonic television has been widely successful, and existing encoders have performed admirably, however, virtually every BTSC encoder now in use has been built using analog circuitry technology. These analog BTSC encoders, and particularly the analog difference channel processing sections, due to their increased complexity have been relatively difficult and expensive to construct. Due to the variability of analog components, complex component selection and extensive calibration have been required to produce acceptable analog difference channel processing sections. Further, the tendency of analog components to drift, over time, away from their calibrated operating points has also made it difficult to produce an analog difference channel processing section that consistently and repeatably performs within a given tolerance. A digital difference channel processing section, if one could be built, would not suffer from these problems of component selection, calibration, and performance drift, and could potentially provide increased performance.

Further, the analog nature of existing BTSC encoders has made them inconvenient to use with newly developed, increasingly popular, digital equipment. For example, television programs can now be stored using digital storage media such as a hard disk or digital tape, rather than the traditional analog storage media, and in the future increasing use will be made of digital storage media. Generating a BTSC signal from a digitally stored program now requires converting the digital audio signals to analog signals and then applying the analog signals to an analog BTSC encoder. A digital BTSC encoder, if one could be built, could accept the digital audio signals directly and could therefore be more easily integrated with. other digital equipment.

While a digital BTSC encoder would potentially offer several advantages, there is no simple way to construct an encoder using digital technology that is functionally equivalent to the idealized encoder 100 defined by the BTSC standard. One problem is that the BTSC standard defines all the critical components of idealized encoder 100 in terms of analog filter transfer functions. As is well known, while it is generally possible to design a digital filter so that either the magnitude or the phase response of the digital filter matches that of an analog filter, it is extremely difficult to match both the amplitude and phase responses without requiring large amounts of processing capacity for processing data sampled at very high sampling rates or without significantly increasing the complexity of the digital filter. Without increasing either the sampling frequency or the filter order, the amplitude response of a digital filter can normally only be made to more closely match that of an analog filter at the expense of increasing the disparity between the phase responses of the two filters, and vice versa. However, since small errors in either amplitude or phase decrease the amount of separation provided by BTSC encoders, it would be essential for a digital BTSC encoder to closely match both the amplitude and phase responses of an idealized encoder of the type shown at 100 in FIG. 1.

For a digital BTSC encoder to provide acceptable performance, it is critical to preserve the characteristics of the analog filters of an idealized encoder 100. Various techniques exist for designing a digital filter to match the performance of an analog filter; however, in general, none of these techniques produce a digital filter (of the same order as the analog filter) having amplitude and phase responses that exactly match the corresponding responses of the analog filter. Ideal encoder 100 is defined in terms of analog transfer functions specified in the frequency domain, or the s-plane, and to design a digital BTSC encoder, these transfer functions must be transformed to the z-plane. Such a transformation may be performed as a "many-to-one" mapping from the s-plane to the z-plane which attempts to preserve time domain characteristics. However, in such a transformation the frequency domain responses are subject to aliasing and may be altered significantly. Alternatively, the transformation may be performed as a "one-to-one" mapping from the s-plane to the z-plane that compresses the entire s-plane into the unit circle of the z-plane. However, such a compression suffers from the familiar "frequency warping" between the analog and digital frequencies. Prewarping can be employed to compensate for this frequency warping effect, however, prewarping does not completely eliminate the deviations from the desired frequency response. These problems would have to be overcome to produce a digital BTSC encoder that performs well and is not unduly complex or expensive.

There is therefore a need for overcoming these difficulties and developing a digital BTSC encoder.

OBJECTS OF THE INVENTION

It is an object of the present invention to substantially reduce or overcome the above-identified problems of the prior art.

Another object of the present invention is to provide an adaptive digital weighing system.

Still another object of the present invention is to provide an adaptive digital weighing system for encoding an electrical information signal of a predetermined bandwidth so that the information signal can be recorded on or transmitted through a dynamically-limited, frequency dependent channel having a narrower dynamically-limited portion in a first spectral region than in at least one other spectral region of the predetermined bandwidth.

And another object of the present invention is to provide a digital BTSC encoder.

Yet another object of the present invention is to provide a digital BTSC encoder that prevents ticking, a problem that can arise with substantially zero input signal levels.

And another object of the present invention is to provide a digital BTSC encoder that uses a sampling frequency that is a multiple of a pilot tone signal frequency of 15,734 Hz so as to prevent interference between the signal information of the encoded signal with the pilot tone signal.

Still another object of the invention is to provide a digital BTSC encoder for generating a conditioned sum signal and an encoded difference signal that include substantially no signal energy at the pilot tone frequency of 15,734 Hz.

Yet another object of the present invention is to provide a digital BTSC encoder including a sum channel processing section for generating the conditioned sum signal, and a difference processing section for generating the encoded difference signal, the sum channel processing section including devices for introducing compensatory phase errors into the conditioned sum signal to compensate for any phase errors introduced into the encoded difference signal by the difference channel processing section.

And another object of the present invention is to provide a digital BTSC encoder including a digital variable emphasis unit, the unit including a digital variable emphasis filter characterized by a variable coefficient transfer function, and the unit further including a device for selecting the coefficients of the variable coefficient transfer function as a function of the signal energy of the encoded difference signal.

Yet another object of the present invention is to provide a digital BTSC encoder including a composite modulator for generating a composite modulated signal from the conditioned sum signal and the encoded difference signal.

Still another. object of the present invention is to provide a digital BTSC encoder that may be implemented on a single integrated circuit.

SUMMARY OF THE INVENTION

These and other objects are provided by an improved BTSC encoder that includes an input section, a sum channel processing section, and a difference channel processing section all of which are implemented using digital technology. In one aspect, the input section includes high pass filters for preventing the BTSC encoder from exhibiting "ticking". In another aspect, the BTSC encoder uses a sampling frequency that is equal to an integer multiple of the pilot frequency.

In yet another aspect, the sum channel processing section generates a conditioned sum signal, and the difference channel processing section generates an encoded difference signal, and the sum channel processing section includes components for introducing a phase error into the conditioned sum signal to compensate for any phase errors introduced into the encoded difference signal by the difference channel processing section.

According to yet another aspect, the invention provides an adaptive digital weighing system for encoding an electrical information signal of a predetermined bandwidth so that the information signal can be recorded on or transmitted through a dynamically-limited, frequency dependent channel having a narrower dynamically-limited portion in a first spectral region than in at least one other spectral region of the predetermined bandwidth.

Still other objects and advantages of the present invention will become readily apparent to those skilled in the art from the following detailed description wherein several embodiments are shown and described, simply by way of illustration of the best mode of the invention. As will be realized, the invention is capable of other and different embodiments, and its several details are capable of modifications in various respects, all without departing from the invention. Accordingly, the drawings and description are to be regarded as illustrative in nature, and not in a restrictive or limiting sense, with the scope of the application being indicated in the claims.

BRIEF DESCRIPTION OF THE DRAWINGS

For a fuller understanding of the nature and objects of the present invention, reference should be had to the following detailed description taken in connection with the accompanying drawings in which the same reference numerals are used to indicate the same or similar parts wherein.

DETAILED DESCRIPTION OF THE DRAWINGS

Figure 3:
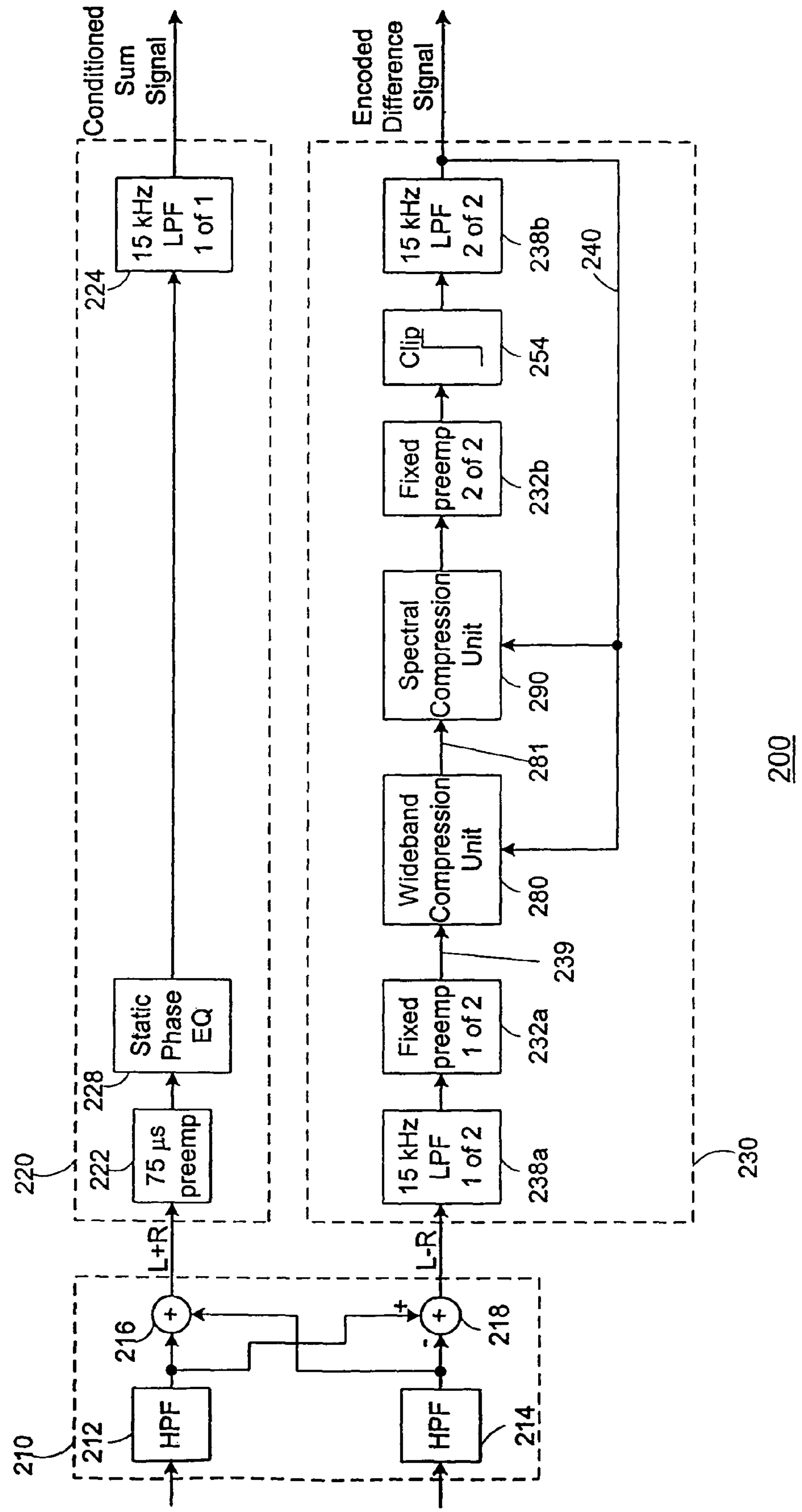
FIG. 3 shows a block diagram of one embodiment of a digital BTSC encoder constructed according to the invention.

FIG. 3 is a block diagram of one embodiment of a digital BTSC encoder 200 constructed according to the invention.

Figure 1:
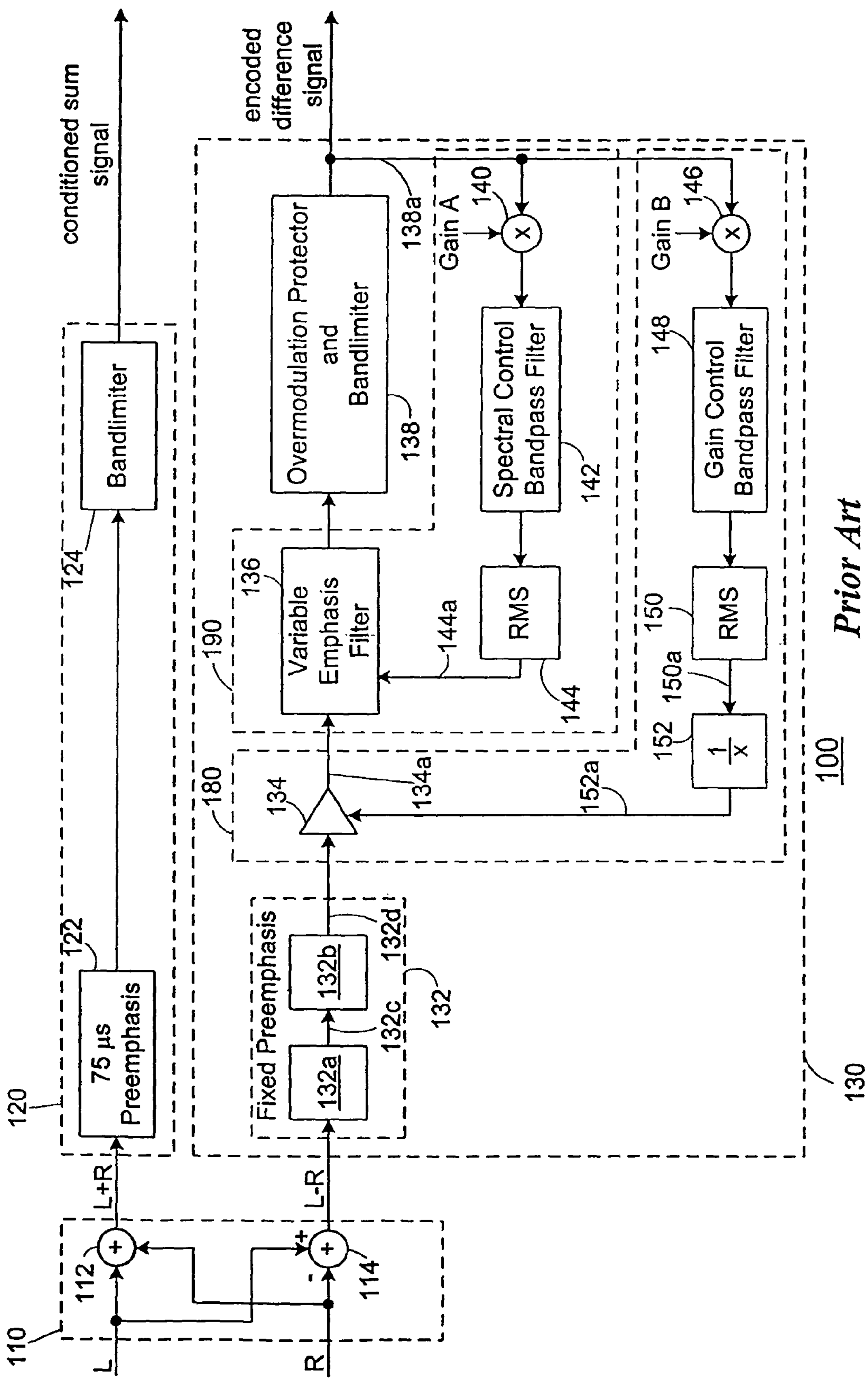
Prior Art Fig. 1
FIG. 1 shows a block diagram of a prior art idealized BTSC encoder.

Digital encoder 200 is constructed to provide performance that is functionally equivalent to the performance of idealized encoder 100 (shown in FIG. 1). As with idealized encoder 100, digital encoder 200 receives the left and right channel audio input signals and generates therefrom the conditioned sum signal and the encoded difference signal, however, in digital encoder 200 these input and output signals are digitally sampled signals rather than continuous analog signals.

The choice of sampling frequency $f_s$ for the left and right channel audio input signals significantly affects the design of digital encoder 200. In the preferred embodiments, the sampling frequency $f_s$ is chosen to be an integer multiple of the pilot frequency $f_H$, so that $f_s=Nf_H$ where N is an integer, and in the most preferred embodiments, N is selected to be greater than or equal to three. It is important for encoder 200 to insure that the conditioned sum and encoded difference signals do not contain enough energy at the pilot frequency $f_H$ to interfere with the pilot tone that is included in the composite signal. As will be discussed in greater detail below, it is therefore desirable for at least some of the filters in digital encoder 200 to provide an exceptionally large degree of attenuation at the pilot frequency $f_H$, and this choice of sampling frequency $f_s$ simplifies the design of such filters.

Digital encoder 200 includes an input section 210, a sum channel processing section 220 and a difference channel processing section 230. Rather than simply implementing the difference channel processing section 230 using digital technology, all three sections 210, 220, 230 are implemented entirely using digital technology. Many of the individual components in digital encoder 200 respectively correspond to individual components in idealized encoder 100. In general, the components of digital encoder 200 have been selected so that their amplitude responses closely match the respective amplitude responses of their corresponding components in encoder 100. This often results in there being a relatively large difference between the phase responses of corresponding components. According to one aspect of the present invention, means are provided in digital encoder 200 for compensating for or nullifying these phase differences, or phase errors. As those skilled in the art will appreciate, relatively small phase errors in the difference channel processing section 230 may be compensated for by. introducing similar phase errors in the sum channel processing section 220, and implementing the sum channel processing section using digital technology simplifies the introduction of such desired compensating phase errors.

The input section 210 of encoder 200 includes two high pass filters 212, 214, and two signal adders 216, 218. The left channel digital audio input signal L is applied to the input of high pass filter 212, the latter generating therefrom an output signal that is applied to positive input terminals of adders 216, 218. The right channel audio input signal R is applied to the input of high pass filter 214 which generates therefrom an output signal that is applied to a positive input terminal of adder 216 and to a negative input terminal of adder 218. Adder 216 generates a sum signal (indicated in FIG. 3 as "L+R") by summing the output signals generated by filters 212 and 214. Adder 218 generates a difference signal (indicated in FIG. 3 as "L−R") by subtracting the output signal generated by filter 214 from the output signal generated by filter 212. Input section 210 is therefore similar to input section 110 (shown in FIG. 1) however, section 210 additionally includes the two high pass filters 212, 214 and generates digital sum and difference signals.

High pass filters 212, 214 preferably have substantially identical responses and preferably remove D.C. components from the left and right channel audio input signals. As will be discussed in greater detail below, this D.C. removal prevents encoder 200 from exhibiting a behavior referred to as "ticking". Since the audio information content of the left and right channel audio input signals of interest is considered to be within a frequency band between 50 Hz and 15,000 Hz, removal of D.C. components does not interfere with the transmission of the information content of the audio signals. Filters 212, 214, therefore, preferably have a cutoff frequency below 50 Hz, and more preferably have a cutoff frequency below 10 Hz so that they will not remove any audio information contained in the audio input signals. Filters 212, 214 also preferably have a flat magnitude response in their passband. In one preferred embodiment, filters 212, 214 are implemented as first order infinite impulse response (IIR) filters, each having a transfer function H(z) given by the formula shown in the following Equation (1).

$$H(z) = \frac{1 - z^{1-}}{1 + a_1 z^{-1}} \tag{1}$$

Referring again to FIG. 3, the sum channel processing section 220 receives the sum signal and generates therefrom the conditioned sum signal. In particular, the sum signal is applied to a 75 μs preemphasis filter 222. The filter 222 in turn generates an output signal that is applied to a static phase equalization filter 228. The filter 228 generates an output signal that is applied to a low pass filter 224 of section 220 which in turn generates the conditioned sum signal.

The 75 μs As preemphasis filter 222 provides signal processing that is partially analogous to the filter 122 (shown in FIG. 1) of idealized encoder 100. The amplitude response of filter 222 is preferably selected to closely match that of filter 122. As will—be discussed further below, means are preferably provided in difference channel processing section 230 for compensation for any differences in the phase responses of filters 222 and 122. In one preferred embodiment, filter 222 is implemented as a first order HR filter having a transfer function H(z) that is described by the formula shown in the following Equation (2).

$$H(z) = \frac{b_0 = b_1 z^{1-}}{1 + a_1 z^{-1}} \tag{2}$$

Static phase equalization filter 228 performs processing that is not directly analogous to any of the components in idealized encoder 100 (shown in FIG. 1). As will be discussed in greater detail below, static phase equalization filter 228 is used to introduce phase errors that compensate for phase errors. introduced by difference processing section 230. Briefly, static phase equalization filter 228 is preferably an "all-pass" filter having a relatively flat amplitude response and a selected phase response.

In one preferred embodiment, filter 228 is implemented as a first order HR filter having a transfer function H(z) that is described by the formula shown in the following Equation (3).

$$H(z) = \frac{a_0 + z^{-1}}{1 + a_0 z^{-1}} \tag{3}$$

Low pass filter 224 provides processing that is partially analogous to bandlimiter 124 (shown in FIG. 1) of encoder 100. Low pass filter 224 preferably provides a flat amplitude response in a pass band of zero to 15 kHz and a relatively sharp cutoff above 15 kHz. Filter 224 also preferably provides an exceptionally large degree of attenuation at the frequency $f_H$ of the pilot tone (i.e., 15,734 Hz). By providing this exceptionally large degree of attenuation, filter 224 insures that the conditioned sum signal does not include enough energy at the pilot frequency $f_H$ to interfere with the pilot tone used in the composite signal. As discussed above, selecting the sampling frequency $f_s$ to be equal to an integer multiple of the pilot frequency $f_H$ simplifies the design of a filter that provides an exceptionally large degree of attenuation at the pilot frequency and therefore simplifies the design of filter 224. Filter 224 preferably has a null at the pilot frequency $f_H$ and preferably provides at least 70 dB of attenuation for all frequencies from the pilot frequency $f_H$ up to one-half the sample rate.

Figure 4A:
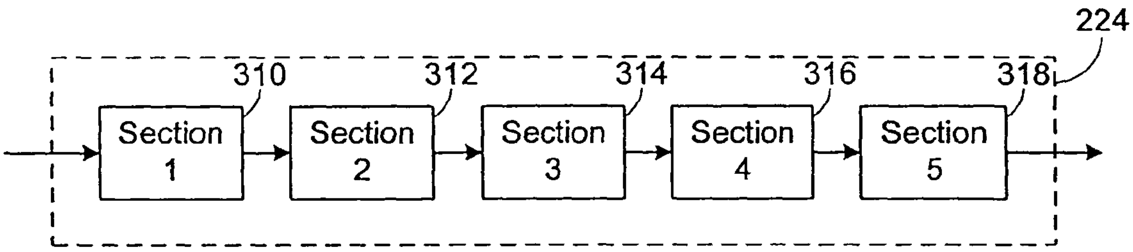
FIGS. 4A-C show block diagrams of low pass filters used in the digital BTSC encoder shown in FIG. 3.

FIG. 4A is a block diagram illustrating one preferred embodiment of low pass filter 224. As shown in FIG. 4A, filter 224 may be implemented by cascading five filter sections 310, 312, 314, 316, 318. In one preferred embodiment, all five filter sections 310, 312, 314, 316, 318 are each implemented as a second order HR filter having transfer functions H(z) which are described by the formula shown in the following Equation (4).

$$H(z) = \frac{b_0 + b_1 z^{-1} + b_2 z^{-2}}{1 + a_1 z^{-1} + a_2 z^{-2}} \quad (4)$$

So in the embodiment shown in FIG. 4A, filter 224 is tenth order HR filter.

Referring again to FIG. 3, the difference channel processing section 230 receives the difference signal and generates therefrom the encoded difference signal. The difference signal is applied to a low pass filter 238*a* which generates therefrom an output signal that is applied to a fixed preemphasis filter 232*a*. The latter generates an output signal that is applied via line 239 to an input terminal of a wideband compression unit 280, and the encoded difference signal is applied via feedback line 240 to a detector terminal of wideband compression unit 280. The latter generates an output signal that is applied via line 281 to an input terminal of a spectral compression unit 290, and the encoded difference signal is also applied via feedback line 240 to a detector terminal of unit 290. The latter generates an output signal that is applied to a fixed preemphasis filter 232*b* which in turn generates an output signal that is applied to a clipper 254. Clipper 254 generates an output signal that is applied to a low pass filter 238*b* which in turn generates the encoded difference signal.

Low pass filters 238*a*, 238*b*, together form a low pass filter 238 that performs processing that is partially analogous to the bandlimiter portion of overmodulation protector and bandlimiter 138 (shown in FIG. 1) of idealized encoder 100. Preferably, filter 238 is implemented so that it is substantially identical to low pass filter 224, which is used in the sum channel processing section 220. Any phase errors introduced into the encoded difference signal by filter 238 are therefore compensated by balancing phase errors that are introduced into the conditioned sum signal by filter 224. Filter 238 is preferably split into two sections 238*a*, 238*b* as shown for reasons which will be discussed in greater detail below, and filter 238*a* preferably has a null at the pilot frequency $f_H$.

Figure 4B:
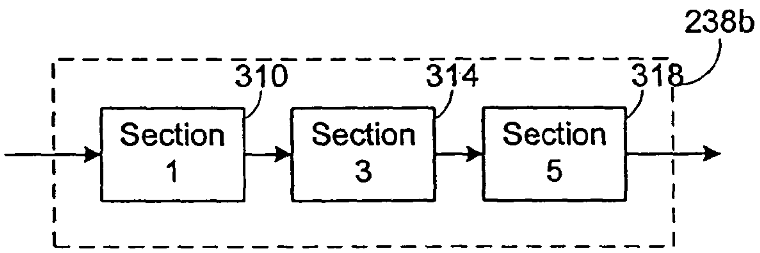
Figure 4C:
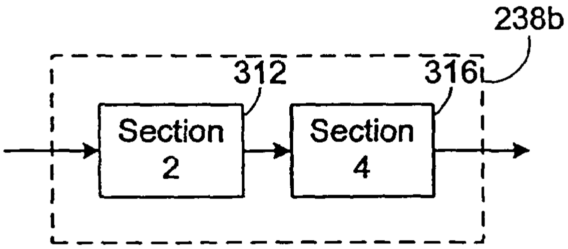

FIGS. 4B-C are block diagrams illustrating one preferred embodiment of the respective filters 238*a* and 238*b*. As shown in FIG. 4B, filter 238*a* may be implemented by cascading three filter sections 310, 314, 318 that are identical to three of the filter sections used in filter 224 (shown in FIG. 4A), and as shown in FIG. 4C, filter 238*b* may be implemented by cascading two filter sections 312, 316 that are identical to the two remaining sections used in filter 224.

Fixed preemphasis filters 232*a*, 232*b* (shown in FIG. 3) together form a fixed preemphasis filter 232 that performs processing that is partially analogous to filter 132 (shown in FIG. 1) of idealized encoder 100. The amplitude response of filter 232 is preferably selected to closely match the amplitude response of filter 132. In one embodiment, the phase responses of filters 232 and 132 are significantly different, and as will be discussed in greater detail below, the resulting phase errors are compensated for by filters 222 and 228 in the sum channel processing section 220. Filter 232 is preferably split into two sections 232*a*, 232*b* as shown for reasons that will be discussed below. In one preferred embodiment, filters 232*a*, 232*b* are each implemented as first order BR filters having transfer functions H(z) that are described by the formula shown in Equation (2). So in this embodiment filter 232 is a second order IIR filter.

In one preferred embodiment, the difference between the phase responses of filters 232*b* and 132*a* closely matches the difference between the phase responses of filters 222 and 122. Therefore, the phase error introduced into the encoded difference signal by fixed preemphasis filter 232*b* is balanced by the phase error introduced into the conditioned sum signal by 75 μs preemphasis filter 222. Further, in this embodiment, the phase response of static phase equalization filter 228 is selected to closely match the difference between the phase responses of fixed preemphasis filter 232*a* and filter 132*b*, so that any phase error introduced into the encoded difference signal by filter 232*a* is balanced by a compensatory phase error in the conditioned sum signal that is introduced by static phase equalization filter 228.

Clipper 254 performs processing that is partially analogous to the overmodulation protection portion of overmodulation protector and bandlimiter 138 (shown in FIG. 1) used in idealized encoder 100. Briefly, clipper 254 is implemented as a thresholding device, however, the operation of clipper 254 will be discussed in greater detail below.

Wideband compression unit 280 and spectral compression unit 290 perform processing functions that are partially analogous to that of units 180 and 190, respectively, of idealized encoder 100 (shown in FIG. 1). Briefly, wideband compression unit 280 dynamically compresses the signal on line 239 as a function of the overall energy level in the encoded difference signal and spectral compression unit 290 further compresses high frequency portions of the signal on line 281 as a function of high frequency energy in the encoded difference signal.

Figure 5:
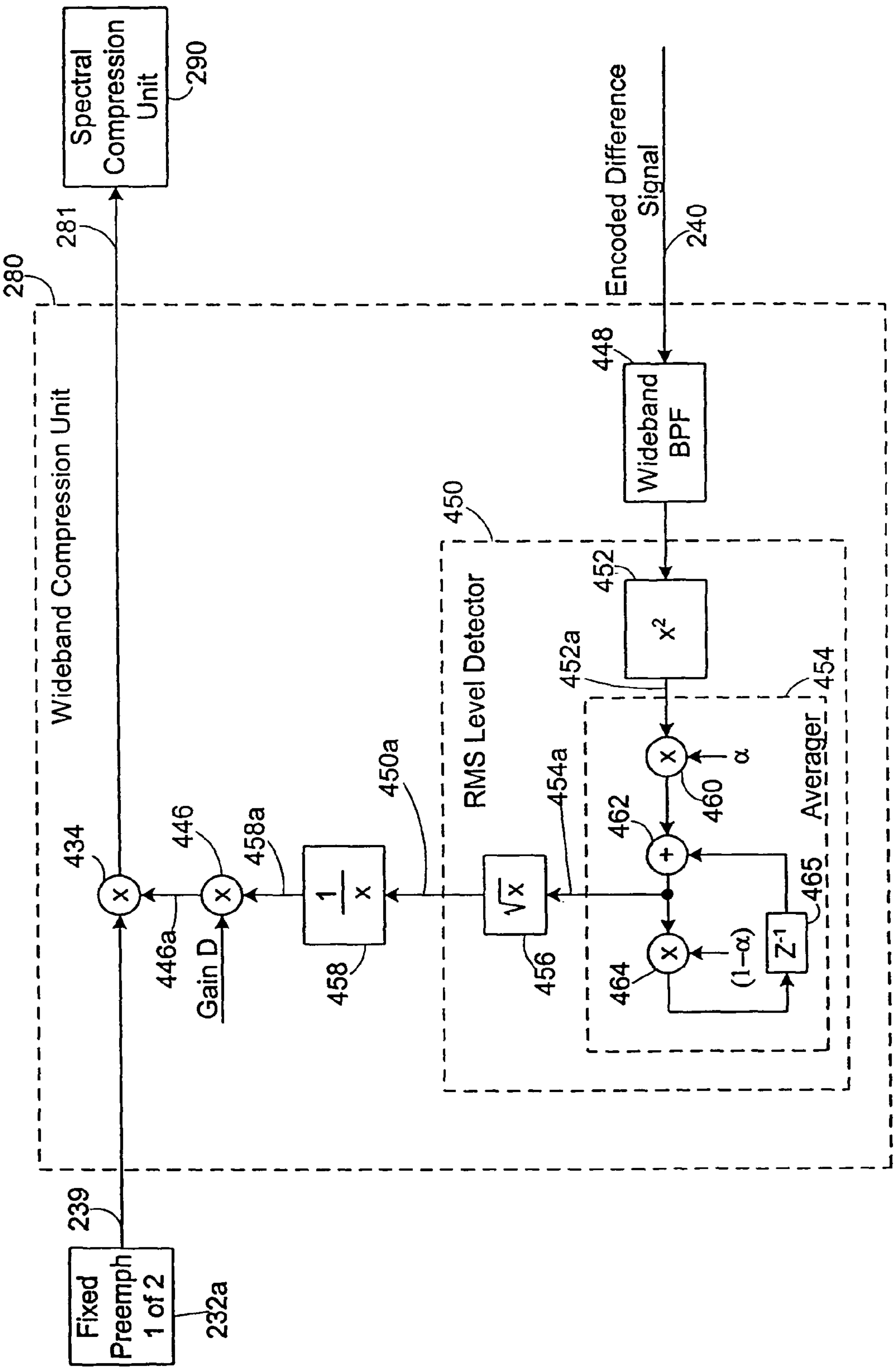
FIG. 5 shows a detailed block diagram of the wideband compression unit used in the digital BTSC encoder shown in FIG. 3.

FIG. 5 shows a block diagram of a preferred embodiment of a digital wideband compression unit 280. Unit 280 includes a digital signal multiplier 434, a digital signal multiplier 446, a wideband digital bandpass filter 448, a digital RMS level detector 450, and a digital reciprocal generator 458. These components perform processing functions partially analogous to those performed by amplifier 134, amplifier 146, bandpass filter 148, RMS level detector 150, and reciprocal generator 152, respectively, of idealized encoder 100 (shown in FIG. 1). The encoded difference signal is applied via feedback path 240 to an input of wideband digital bandpass filter 448 which generates therefrom an output signal that is applied to RMS level detector 450. The latter generates an output signal that is representative of the RMS value of the output signal generated by filter 448 and applies this output signal via line 450*a* to reciprocal generator 458.

Reciprocal generator 458 then generates an output signal representative of the reciprocal of the signal on line 450*a* and applies this output signal via line 458*a* to multiplier 446. Digital signal multiplier 446 multiplies the signal on line 458*a* by the value of the gain setting, Gain D, and thereby generates an output signal that is representative of D times the reciprocal of the RMS value and that is applied via line 446*a* to an input terminal of multiplier 434. The output signal generated by fixed preemphasis filter 232*a* is applied via line 239 to another input terminal of multiplier 434. Multiplier 434 multiplies the signal on line 239 by the signal on line 446*a* and thereby generates the output of wideband compression unit 280 which is applied via line 281 to the input of spectral compression unit 290.

Wideband digital bandpass filter 448 is designed to have an amplitude response that closely matches the amplitude response of bandpass filter 148 (shown in FIG. 1). One preferred choice is to select filter 448 so that the mean square difference between its amplitude response and that of filter 148 are minimized. In one embodiment, the phase response of filters 448 and 148 are substantially different, but since the output signal of the RMS level detector 450 is substantially insensitive to the phase of its input signal, these phase differences may be ignored. In one preferred embodiment, wideband bandpass filter 448 is implemented as a second order IIR filter having a transfer function H(z) that is described by the formula shown in Equation (4).

RMS level detector 450 is designed to approximate the performance of detector 150 which is used in idealized encoder 100 (shown in FIG. 1). Detector 450 includes a signal squaring device 452, a signal averaging device 454, and a square root device 456. Squaring device 452 squares the signal generated by bandpass filter 448 and applies this squared signal via line 452*a* to averaging device 454. The latter computes a time weighted average of the signal on line 452*a* and applies the average via line 454*a* to square root device 456. Square root device 456 calculates the square root of the signal on line 454*a* and thereby generates a signal on line 450*a* representative of the RMS value of the output signal generated by wideband digital bandpass filter 448.

Averaging device 454 includes a digital signal multiplier 460, a digital signal adder 462, a digital signal multiplier 464, and a delay register 465. The output signal generated by squaring device 452 is applied via line 452*a* to one input of multiplier 460 which generates an output signal by scaling the signal on line 452*a* by a constant α. The scaled output signal generated by multiplier 460 is applied to one input of adder 462 and an output signal generated by delay register 465 is applied to the other input of adder 462. Adder 462 generates an output signal by summing the signals present at its two inputs, and this summed signal is the output signal of averaging device 454 and is applied to square root device 456 via line 454*a*. This summed signal is also applied to one input of multiplier 464 which generates an output signal by scaling the summed signal by the constant (1−α). The output signal generated by multiplier 464 is applied to an input of delay register 465. Those skilled in the art will appreciate that averager 454 is a recursive filter and implements a digital averaging function that is described by the recursive formula shown in the following Equation (5).

$$y(n)=\alpha x(n)+(1-\alpha)y(n-1) \quad (5)$$

in which y(n) represents the current digital sample of the signal output by averager 454 on line 454*a*, y(n−1) represents the previous digital sample of the signal output by averager 454 on line 454*a*, and x(n) represents the current digital sample of the signal output by squaring device 452 on line 452*a*. Those skilled in the art will appreciate that averager 454 provides a digital approximation of the analog averaging function defined in the BTSC standard and implemented by RMS level detector 150 (shown in FIG. 1) of idealized encoder 100. The constant a is preferably chosen so that the time constant of RMS level detector 450 closely approximates the corresponding time constant specified in the BTSC standard for RMS level detector 150.

Digital square root device 456 and digital reciprocal generator 458 are shown in FIG. 5 as two separate components, however, those skilled in the art will appreciate that these two components may be implemented using a single device that generates an output signal representative of the reciprocal of the square root of its input signal. Such a device may be implemented for example as a memory look up table (LUT), or alternatively may be implemented using processing components that calculate a Taylor series polynomial approximation of the inverse square root function.

Figure 6:
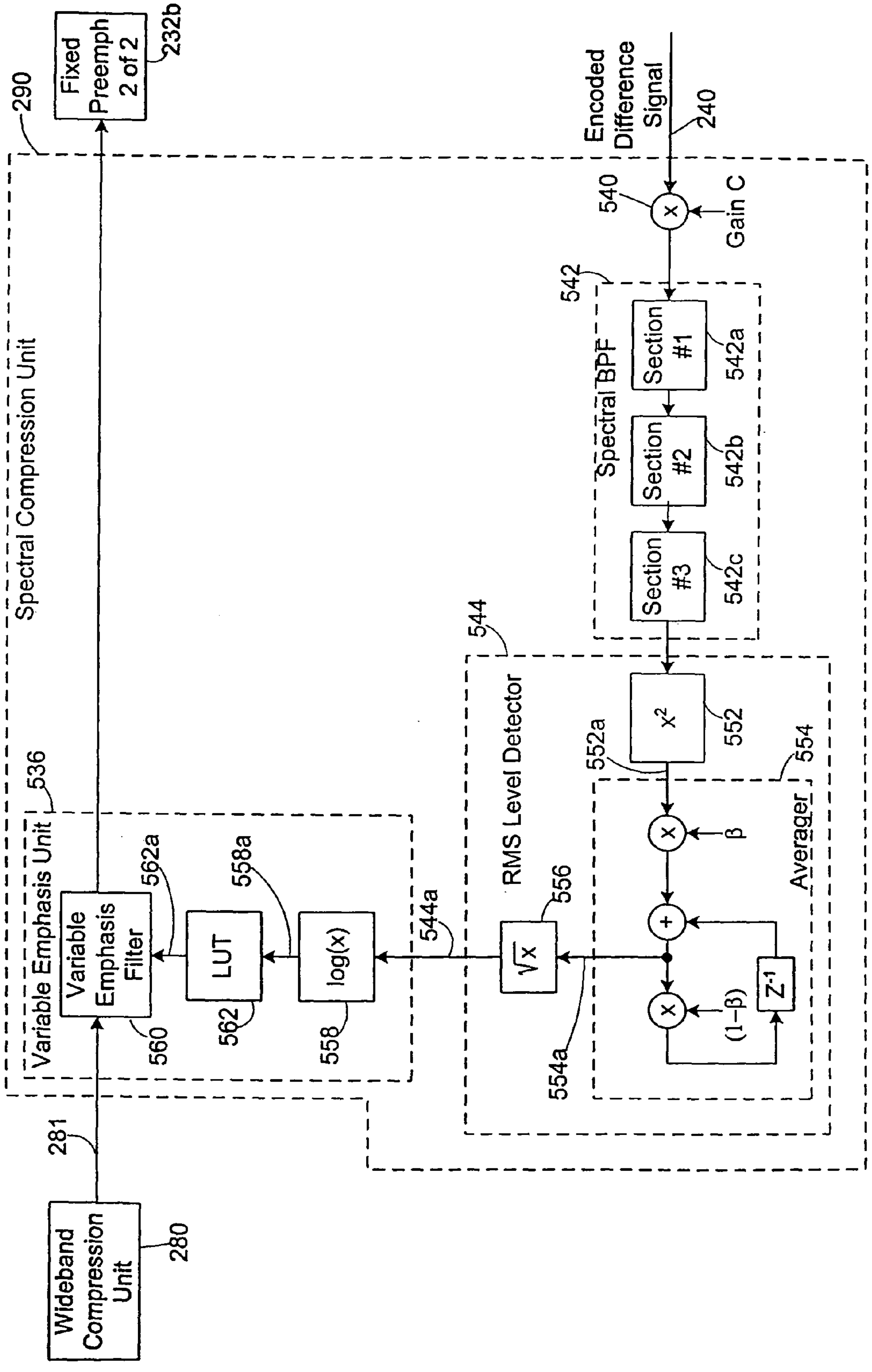
FIG. 6 shows a block diagram of the spectral compression unit used in the digital BTSC encoder shown in FIG. 3.

FIG. 6 shows a block diagram of a preferred embodiment of spectral compression unit 290. Unit 290 includes a variable preemphasis/deemphasis unit (hereinafter referred to as the "variable emphasis unit") 536, a signal multiplier 540, a spectral band pass filter 542, and an RMS level detector 544, and these components provide processing which is partially analogous to that of variable emphasis filter 136, amplifier 140, bandpass filter 142, and RMS level detector 144, respectively, of idealized encoder 100 (shown in FIG. 1). The encoded difference signal is applied via feedback line 240 to an input of signal multiplier 540 which generates an output signal by multiplying the encoded difference signal by the fixed gain setting value of Gain C. The amplified output signal generated by signal multiplier 540 is applied to spectral bandpass filter 542 which generates an output signal that is applied to RMS level detector 544. The latter generates an output signal that is applied via line 544*a* to a control terminal of variable emphasis unit 536, and the output signal generated by wideband compressor unit 280 is applied via line 281 to an input terminal of unit 536. The latter dynamically varies tie frequency response applied to the signal on line 281 according to a function of the signal on line 544*a*, the latter signal being a function of the signal energy of the encoded difference signal within the frequency band passed by spectral band pass filter 542. The output signal of unit 290, which is generated by unit 536 and is applied to the input of fixed preemphasis filter 232*b*, is thus dynamically compressed a greater amount in the high frequency portions of the signal than in the remainder of the spectrum of interest.

Spectral bandpass filter 542 is designed to have an amplitude response that closely matches the amplitude response of bandpass filter 142 (shown in FIG. 1) of idealized encoder 100. As with filter 448 (shown in FIG. 5), one preferred choice is to select filter 542 so that the difference between its RMS amplitude response and that of filter 142 are minimized. In one embodiment, the phase response of filters 542 and 142 are substantially different, but since the RMS output of RMS level detector 544 is substantially insensitive to the phase of the input to the detector, these phase differences may be ignored. In one preferred embodiment, spectral bandpass filter 542 is implemented as a cascade of three second order IIR filter sections 542*a*, 542*b*, 542*c* (as shown in FIG. 6) each having a transfer function H(z) that is described by the formula shown in Equation (4).

RMS level detector 544 is designed to approximate the performance of detector 144 which is used in idealized encoder 100 (shown in FIG. 1). Detector 544 includes a signal squaring device 552, a signal averaging device 554, and a square root device 556. Squaring device 552 squares the signal generated by spectral bandpass filter 542 and applies this squared signal via line 552*a* to averaging device 554. The latter functions similarly to averaging device 454 (shown in FIG. 5) which is used in the wideband compression unit 280, although device 554 preferably uses a constant β different from the constant α. The behavior of averaging device 554 is of course also described by Equation (5) when β is substituted for α. The constant β is preferably selected for device 554 so that the time constant of RMS level detector 544 closely approximates the corresponding time constant specified by the BTSC standard for RMS level detector 144 (shown in FIG. 1). Averaging device 554 computes a time weighted average of the signal on line 552*a* and applies the average to square root device 556 via line 554*a*. Square root device 556 calculates the square root of the signal on line 554*a* and thereby generates a signal on line 544*a* as a function of the RMS value of the output signal generated by spectral bandpass filter 542.

The signal on line 544*a* is applied to the control terminal of variable emphasis unit 536. Variable emphasis unit 536 performs processing that is partially analogous to filter 136 (shown in FIG. 1) of idealized encoder 100. As defined by the BTSC standard, filter 136 has amplitude and phase responses that vary as a function of the output signal generated by RMS level detector 144. One preferred way to implement unit 536 so that it has similar variable responses is to use a digital filter having variable coefficients that determine its transfer function and to select the value of the coefficients during any given sample period, or group of sample periods, based on the value of the signal on line 544*a*.

FIG. 6 shows one embodiment of variable emphasis unit 536 which includes a logarithmic generator 558, a variable emphasis filter 560, and a look up table LUT 562. The output signal generated by RMS level detector 544 is applied via line 544*a* to logarithmic generator 558. The latter generates a signal on line 558*a* that is representative of the logarithm of the signal on line 544*a* and applies this signal to LUT 562. LUT 562 generates an output signal selected from the LUT and representative of filter coefficients to be used by variable emphasis filter 560. The coefficients thus generated by LUT 562 are applied via line 562*a* to a coefficient selection terminal of variable emphasis filter 560. The output signal generated by wideband compression unit 280 is applied to an input terminal of variable emphasis filter 560 via line 281. Variable emphasis filter 560 generates the output signal of spectral compression unit 290 which is applied to the input of fixed preemphasis filter 232*b*.

Variable emphasis filter 560 is designed to have a variable amplitude response that closely matches the variable amplitude response of filter 136 (shown in FIG. 1) of idealized encoder 100. Variable emphasis filter 560 provides a similar variable response by using a variable coefficient transfer function (i.e., the coefficients of the transfer function H(z) of filter 560 are variable) and by allowing LUT 562 to select the value of the coefficients during intervals based on the sample period. As will be described in greater detail below, LUT 562 stores the values of the filter coefficients used by filter 560, and during each sample period, or during any selected group of sample periods, LUT 562 selects a set of filter coefficients as a function of the output signal generated by logarithmic generator 558 on line 558*a*. In one preferred embodiment, variable emphasis filter 560 is implemented as a first order DR filter having a transfer function H(z) that is described by the formula shown in the following Equation (6).

$$H(z) = \frac{b_0 b_1 z^{-1}}{1 + a_1 z^{-1}} \tag{6}$$

in which the filter coefficients $b_0$, $b_1$, and $a_1$ are variables that are selected by LUT 562. Methods of selecting the values for the filter coefficients used by filter 560 as well as by the other filters of encoder 200 will be discussed below.

In FIG. 6, logarithmic generator 558 and square root device 556 are shown, for convenience, as two separate components. However, those skilled in the art will appreciate that these two components may be implemented using a single device, such as a LUT, or alternatively using processing components that calculate a Tayler series polynomial approximation of the logarithm of the signal on line 554*a* and by then dividing this value by two. Similarly, in alternative implementations, the functions performed by logarithmic generator 558, square root device 556, and LUT 562 may be incorporated into a single device.

As stated above, high pass filters 212, 214 (shown in FIG. 3) are useful in blocking DC components so as to prevent encoder 200 from exhibiting a behavior known as "ticking". In the context of a stereophonic encoder, ticking refers to relatively low frequency oscillatory behavior of the encoder caused when there is no signal present at the left and right channel audio inputs. The desired behavior of a stereophonic system when there is no signal present at the audio inputs is to remain silent; however, an encoder connected through a decoder to loudspeakers and exhibiting ticking causes the loudspeakers to emit an audible sound, referred to as a "tick", with a somewhat regular period that is partially dependent on the time constant of the RMS level detector in the wideband compressor. More particularly, in encoder 200, when only very low level signals are present at the audio inputs, and when there is a D.C. component, or an offset, present in the signal on line 239, wideband compression unit 280 tends to behave in an unstable fashion that causes ticking.

Consider the case where only a low level audio signal is present on line 239. In such a case, the output of RMS level detector 450 on line 450*a* becomes very small, which in turn causes the gain of multiplier 434 to become very large. If such a low level audio signal on line 239 is constant in its amplitude, the wideband compression unit 280 reaches a steady-state condition after some time (determined by the time constant α applied to multiplier 460), because the encoded difference signal is fed back on line 240 to the wideband compression unit 280. Because the feedback is arranged to be negative, when the audio signal on line 239 increases in its amplitude, the signal on line 450*a* increases, which in turn causes the gain of multiplier 434 to decrease. When the audio signal on line 239 decreases in its amplitude, the signal on line 450*a* decreases, which in turn causes the gain of multiplier 434 to increase.

However, should there be a significant dc signal present on line 239 in addition to a low level audio signal, the dc signal is blocked from the feedback process by the action of wideband bandpass filter 448, which has zero response to dc signals. In particular, any dc present in the encoded difference signal at line 240 is blocked by filter 448, and is not sensed by RMS level detector 450. Any dc signal present on line 239 will be amplified by multiplier 434 along with any audio signal present on line 239, but the amplification factor or gain will be determined only by the audio signal amplitude as sensed by RMS level detector 450 after filtering by filter 448.

As noted above, whenever the amplitude of the audio signal on line 239 varies, the gain of multiplier 434 varies inversely. During such variations in gain, any dc present on line 239 will also be subjected to variable amplification, in effect modulating the dc signal, thereby producing an ac signal. In this fashion such dc signals may be modulated so as to create significant audio-band signals which will not be rejected by filter 448, and are therefore sensed by detector 450. When the audio signal on line 239 is small compared to the do on line 239, small variations in the audio signal level, which cause changes in the gain of amplifier 434, can cause a large change in the dc level (which amount to an ac signal) at line 281 through this modulation process. The ac signal produced tends to increase the overall signal which passes through filter 448, regardless of whether the audio signal variation that gave rise to the ac signal was an increase or decrease in signal level. In particular, should the level of the audio signal on line 239 decrease, the negative feedback process normally increases the gain of multiplier 434. However, if a sufficient dc signal is present in line 239, a decrease in audio signal on line 239 can cause an increase in the signal sensed by detector 450, forcing the gain of multiplier 434 to decrease. In this fashion, the negative feedback process is reversed, and the feedback becomes positive.

Such positive feedback will only persist so long as the modulated dc signal at line 281 is sufficiently large compared to any audio signal present on line 281, when weighted by the response of all the filters and signal modifiers between line 281 and the output of filter 448. Once the gain of multiplier 434 decreases sufficiently such that the modulated dc signal in line 281 no longer provides a significant input to detector 450, the feedback reverts to its normal negative sense. In accordance with the time constant of detector 450, the system will re-acquire an appropriate gain level based on the level of the audio signal in line 239. But, if sufficient dc remains in the signal in line 239, the cycle will repeat itself once the gain of multiplier 434 increases sufficiently. During each such period of positive feedback, a sharp change in the dc level of line 281 is produced. This change is audible, and sounds somewhat similar to the 'tick' of a clock. Since such dc changes will occur with some regularity, based on the time constant of detector 450, the phenomenon is often referred to as 'ticking'.

One method of preventing ticking is to remove any dc components present in the input signal to encoder 200. This is accomplished by high pass filters 212 and 214. Further, high pass filters 212 and 214 help to maximize the dynamic range of encoder 200 by removing dc components which otherwise may use up valuable dynamic range.

As stated above and as shown in FIG. 3, low pass filter 238 is preferably implemented as two filters 238*a* and 238*b*. Splitting filter 238 in this fashion provides several advantages. If filter 238*a* were eliminated, and the entire filter 238 were located after clipper 254 (i.e., in the location of filter 238*b*) then any components above 15 kHz on the audio input signals may cause instability in the wideband compression unit 280 similar to the above-described ticking behavior. This occurs because any signal components above 15 kHz on line 239 will be amplified by multiplier 434 (shown in FIG. 5) and because such components will not be sensed by RMS level detector 450 since such components are filtered out by the low pass filter following clipper 254 (shown in FIG. 3). Since detector 450 increases the gain of multiplier 434 when it senses the absence of a signal, the gain of multiplier 434 can become relatively large when the signal on line 239 consists of little audio signal (under 15 kHz) information, but significant high-frequency (over 15 kHz) information. Multiplier 434 then amplifies the high-frequency information, which can generate large signals that are likely to be clipped by components in processing section 230. This clipping can produce harmonics which may alias to low frequencies that will be sensed by RMS level detector 450 causing the system to tick as described previously. Alternatively, if filter 238*b* were eliminated and the entire filter 238 were located before fixed preemphasis filter 232*a* (i.e., in the location of filter 238*a*) then high frequency artifacts generated by clipper 254 would be included in the encoded difference signal and could interfere with the pilot tone in the composite signal. Therefore, splitting filter 238 as shown provides an optimal arrangement whereby filter 238*a* prevents ticking in compression unit 280 and filter 238*b* filters high frequency artifacts that may be generated by clipper 254.

Fixed preemphasis filter 232 is also preferably split into two filters 232*a*, 232*b* as shown in FIG. 3. Filter 232 typically requires relatively large gain at high frequencies, as is specified in the BTSC standard, and using only a single section to implement filter 232 increases the likelihood of filter 232 causing clipping. It is advantageous to apply some of the gain of filter 232 on the input side of wideband compression unit 280 (with filter 232*a*) and to apply some of the gain of filter 232 on the output side of wideband compression unit 280 (with filter 232*b*). Since unit 280 normally compresses its input signal, distributing the gain of filter 232 around the compression provided by unit 280 decreases that the likelihood that the gain of filter 232 will cause an overflow condition.

To minimize size, power consumption, and cost, encoder 200 is preferably implemented using a single digital signal processing chip. Encoder 200 has been successfully implemented using one of the well known Motorola DSP 56002 digital signal processing chips (this implementation shall be referred to hereinafter as the "DSP Embodiment"). The Motorola DSP 56002 is a fixed point twenty-four bit chip, however, other types of processing chips, such as floating point chips, or fixed point chips having other word lengths, could of course be used. The DSP Embodiment of encoder 200, uses a sampling frequency fs that is equal to three times the pilot frequency $f_H$ (i.e., $f_s$=47202 Hz). The following Table 1 lists all of the filter coefficients used in the DSP Embodiment of encoder 200 except those used in variable emphasis filter 560.

TABLE 1

| Low Pass Filter Section #1) 310 (Equation 4) | Low Pass Filter (Section #2) 312 (Equation 4) |
|---|---|
| $b_0$ = 0.18783270<br>$b_1$ = 0.36310206<br>$b_2$ = 0.18783270<br>$a_1$ = −0.36310206<br>$a_2$ = 0.12709286 | $b_0$ = 0.44892888<br>$b_1$ = 0.70268024<br>$b_2$ = 0.44892888<br>$a_1$ = 0.12638618<br>$a_2$ = 0.47415181 |
| **Low Pass Filter (Section #3) 314 (Equation 4)** | **Low Pass Filter (Section #4) 316 (Equation #4)** |
| $b_0$ = 0.706774027<br>$b_1$ = 0.87637648<br>$b_2$ = 0.706774027<br>$a_1$ = −0.53702472<br>$a_2$ = 0.75298490 | $b_0$ = 0.85733126<br>$b_1$ = 0.91505047<br>$b_2$ = 0.85733126<br>$a_1$ = 0.74320197<br>$a_2$ = 0.89832289 |
| **Low Pass Filter (Section #5) 318 (Equation 4)** | **Wideband Bandpass Filter 448 (Equation 4)** |
| $b_0$ = 0.92737972<br>$b_1$ = 0.092729649<br>$b_2$ = 0.92737972<br>$a_1$ = −0.82951974<br>$a_2$ = 0.97259237 | $b_0$ = −0.02854672<br>$b_1$ = −0.18789051<br>$b_2$ = 0.21643723<br>$a_1$ = −1.75073141<br>$a_2$ = 0.75188028 |
| **Fixed Preemphasis Filter 238a (Equation 2)** | **Fixed Preemphasis Filter 238b (Equation 2)** |
| $b_0$ = 9.50682180<br>$b_1$ = −9.00385663<br>$a_1$ = −0.497064357 | $b_0$ = 4.357528<br>$b_1$ = −3.24843271<br>$a_1$ = 0.10881833 |
| **Spectral Bandpass Filter (Section #1) 542a (Equation 4)** | **Spectral Bandpass Filter (Section #2) 542b (Equation 4)** |
| $b_0$ = 0.646517841<br>$b_1$ = 0.649137616 | $b_0$ = 0.850281278<br>$b_1$ = −0.850247036 |

TABLE 1-continued

| | |
|---|---|
| $b_2 = 0.0$<br>$a_1 = -0.557821757$<br>$a_2 = 0.0$ | $b_2 = 0.0$<br>$a_1 = 0.602159890$<br>$a_2 = 0.0$ |
| Spectral Bandpass Filter (Section #3) 542c (Equation 4) | Static Phase Equalization Filter 224 (Equation 3) |
| $b_0 = 0.597678418$<br>$b_1 = -1.195357770$<br>$b_2 = 0.597679348$<br>$a_1 = -0.776566094$<br>$a_2 = 0.352824276$ | $a_0 = 0.9029$ |
| 75 µs preemphasis Filter 222 (Equation 2) | High Pass Filters 212, 214 (Equation 1) |
| $b_0 = 4.57030583$<br>$b_1 = -3.43823487$<br>$a_1 = -0.131778883$ | $a_1 = -0.999$ |

In the DSP Embodiment of encoder 200 the value of the constant α that is used by averager 454 (shown in FIG. 5) in wideband compression unit 280 is set equal to 0.0006093973517, and the value of the constant β that is used by averager 554 (shown in FIG. 6) in spectral compression unit. 290 is set equal to 0.001825967. Further, the values of Gain C and Gain D used by amplifiers 540 and 446, respectively, in the spectral and wideband compression units are set equal to 0.5011872 and 0.08984625, respectively, to insure that the DSP Embodiment of encoder 200 performs similarly to encoder 100.

Figure 7:
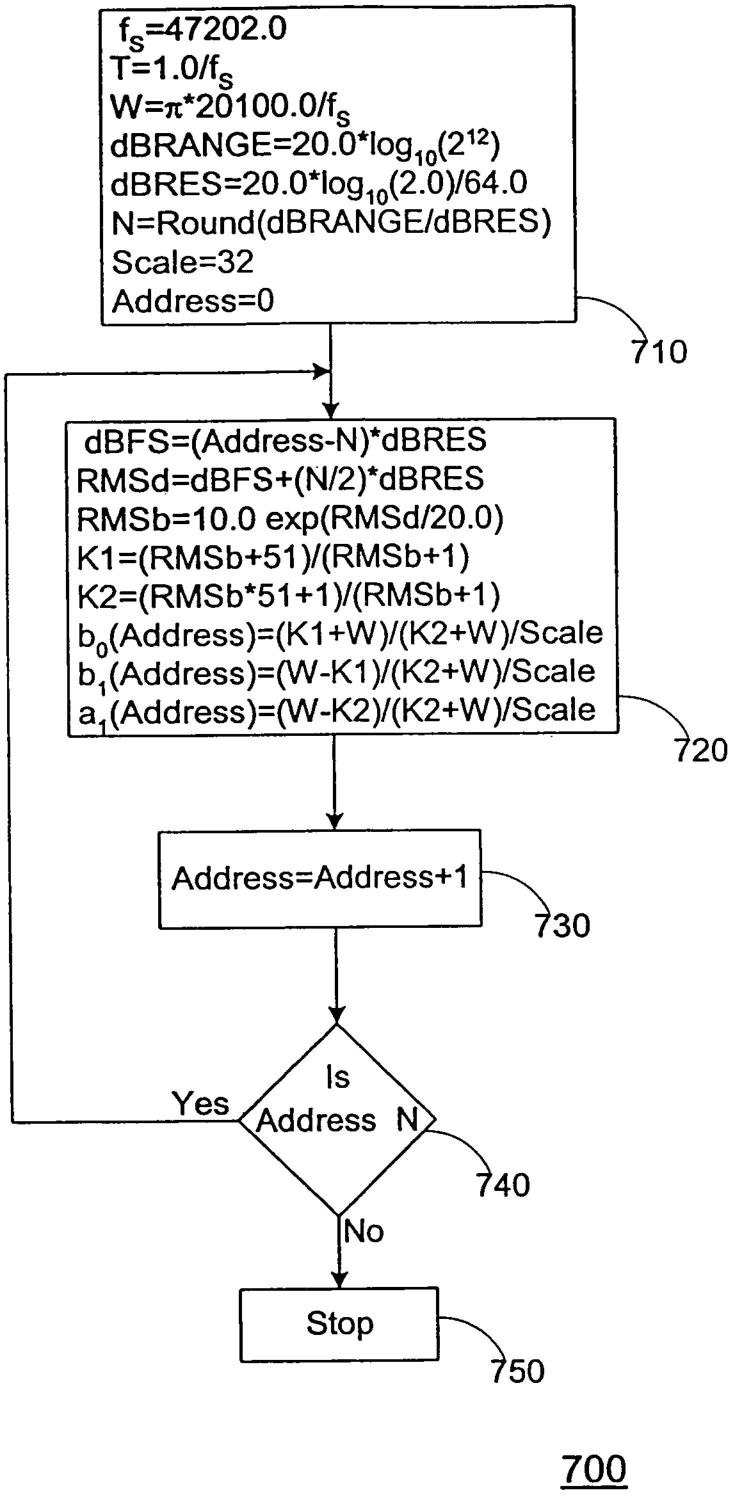
FIG. 7 shows a flow chart used for calculating the filter coefficients of the variable emphasis filter used in the spectral compression unit shown in FIG. 6.

FIG. 7 shows a flow chart 700 that describes one preferred method for pre-calculating all the sets of filter coefficients used by variable emphasis filter 560 (shown in FIG. 6) in the DSP Embodiment of encoder 200. Prior to operation of encoder 200, all the sets of filter coefficients used by filter 560 are pre-calculated (e.g., by a general purpose digital computer) and are loaded into LUT 562. In the DSP Embodiment of encoder 200, filter 560 has a transfer function H(z) that is described by Equation (6) so flow chart 700 describes the calculation of the coefficients $b_0$, $b_1$, and $a_1$. As specified in the BTSC standard, the transfer function of S(f,b) of analog filter 136 (shown in FIG. 1) to which filter 560 partially corresponds, is described by the formula shown in the following Equation (7).

$$S(f, b) = \frac{1 + \frac{\left(\frac{jf}{F}\right)^{(b+51)}}{(b+1)}}{1 + \frac{\left(\frac{jf}{F}\right)^{(1+51b)}}{(b+1)}}$$

in which F is equal to 20.1 kHz.

The first step in flow chart 700 in an initialization step 710 during which several variables are initialized. Specifically, the sampling frequency $f_s$ is set equal to 47202 Hz, and the period T is set equal to $1/f_s$. The variable W is a digital version of the variable F used in Equation (7) and is set equal to $\pi(20.1\ \text{kHz})/f_s$. The variable dBRANGE represents the desired signal range of the RMS detectors in the spectral compression unit, and for the DSP Embodiment dBRANGE is set equal to 72.25 dB. The variable dBRES relates to the sensitivity of filter 560 to changes in the energy level of the encoded difference signal. In the DSP Embodiment of encoder 200, dBRES is set equal to 0.094 dB so that filter 560 will use coefficients based on the value of the signal on line 558*a* quantized to the nearest 0.094 dB. The variable N equals the total number of sets of filter coefficients used in filter 560 and N is calculated by dividing the sensitivity (dBRES) into the range (dBRANGE) and rounding to the nearest integer. In the DSP Embodiment, N is equal to 768 although those skilled in the art will appreciate that this number can be changed which will vary the sensitivity or the range. In the DSP Embodiment, LUT 562 stores 769 sets of coefficients for filter 560, and of course if N is increased, a larger LUT will be used to store the extra sets of filter –34 coefficients. Further, those skilled in the art will appreciate that logarithmic generator 558 scales the signal on line 558*a* and thereby reduces the number of filter coefficient sets stored by LUT 562, for a given minimum quantization of the value of the signal on line 558*a*. However, in other embodiments, logarithmic generator 558 may be eliminated and LUT 562 may store a correspondingly larger number of filter coefficient sets. Finally, the variables Scale and Address are set equal to 32 and zero, respectively. The variable Scale, which is only used in fixed point implementations, is selected so that all the filter coefficients have a value greater than or equal to negative one and less than one (where the filter coefficients are represented in twos complement).

Following initialization step 710, a coefficient generation step 720 is executed. During the first execution of step 720, variables $b_0(0)$, $b_1(0)$, and $a_1(0)$ are calculated which correspond to values of the coefficients $b_0$, $b_1$, and $a_1$ that are to be stored at address location zero of LUT 562. Following this execution of step 720, an incrementing step 730 is executed during which the value of the variable Address is incremented. Following step 730 a comparison step is executed during which the values of the variables Address and N are compared. If Address is less than or equal to N, then steps 720, 730, and 740 are reexecuted iteratively so that values of the coefficients $b_0$, $b_1$, and $a_1$ are calculated for each of the 769 addresses of LUT 562. When step 740 detects that the value of Address is greater than N, then all 769 sets of coefficients have been calculated and execution of flow chart 700 proceeds to a concluding step 750.

In coefficient generation step 720, the variable dBFS corresponds to the output of logarithmic generator 558. As the value of the variable Address ranges from zero to 769, the value of dBFS ranges from about −72.25 to zero dB corresponding to the signal range of about 72.25 dB provided by the DSP Embodiment of encoder 200 (where zero dB corresponds to the full modulation). The variable RMSd corresponds to the 'output of the analog RMS level detector 144 (shown in FIG. 1), and as the variable Address ranges from zero to 769, the value of RMSd ranges from about −36 to 36 dB corresponding to the signal range of 72 dB provided by typical prior art analog BTSC encoders. The variable RMSb is a linear version of the variable RMSd, and RMSb corresponds to the variable b in the transfer function S(f,b) described in Equation (7). The variables K1 and K2 correspond to the (b+51)/(b+1) and the (51b+1)/(b+1) terms, respectively, in Equation (7). The coefficients $b_0$, $b_1$, and $a_1$ are calculated as shown in step 720 using the variables K1; K2, W, and Scale.

Figure 8A:
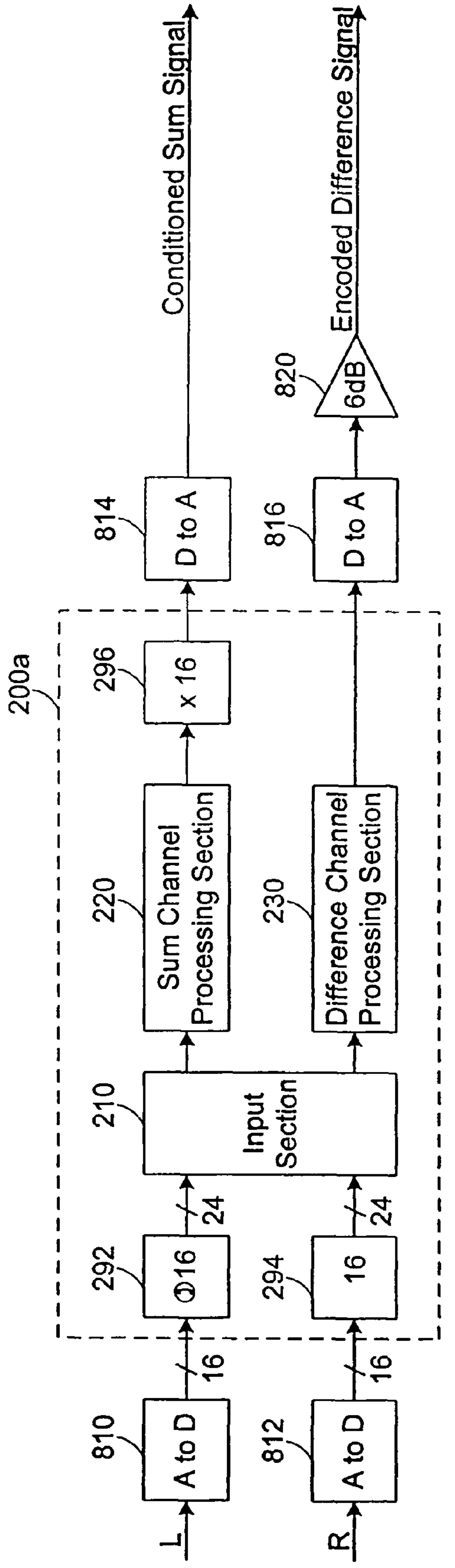
FIGS. 8A-D show block diagrams that illustrate signal scaling that may be used to preserve resolution and decrease the chance of saturation in fixed point implementations of digital BTSC encoders constructed according to the invention.

FIG. 8A shows a block diagram that illustrates one method of using the DSP Embodiment in an analog system, and in FIG. 8A, all components that are implemented in the 56002 integrated circuit are indicated at 200*a*. The analog system supplies analog left and right channel audio input signals (shown in FIG. 8A as "L" and "R", respectively) and these signals are applied to the inputs of sixteen bit analog-to-digital converters 810 and 812, respectively. Converters 810, 812 sample their analog input signals using a sampling frequency $f_s$ that is equal to 47,202 Hz (i.e., $3f_H$) and converters 810, 812 thereby generate sequences of sixteen bit digital samples that are representative of the left and right channel audio input signals, respectively. The signals generated by converters 810 and 812 are applied to encoder 200*a* where they are received by modules 292 and 294, respectively. Modules 292, 294 are "divide by sixteen" modules (which divide the amplitude of their inputs by a factor of 16) and therefore generate output signals that are equal to their input signals divided by sixteen. Since division by any power of two is easily accomplished in a digital system by using a shift register, modules 292, 294 are implemented as shift registers that shift their inputs by four binary places.

As stated above, the 56002 chip is a fixed point twenty-four bit processor, and the samples applied to the chip by converters 810, 812 are in twos complement representation. Modules 292, 294 divide the samples generated by converters 810, 812 by sixteen and thereby place each of the samples in the middle of a twenty-four bit word. So in every sample generated by modules 292, 294, the four most significant bits are sign bits and the four least significant bits are zeros, and the sixteen bits in the middle of the word correspond to one sample generated by one of the converters 810, 812. Padding each twenty-four bit word with sign bits at the high end and with zeros at the low end in this fashion preserves accuracy and allows intermediate signals generated by encoder 200*a* to exceed sixteen bits without causing an error condition such as an overflow.

In encoder 200*a*, each bit of the twenty-four bit word corresponds roughly to 6 dB of signal range, and therefore modules 292, 294 correspond to −24 dB (i.e., negative 6 times 4) attenuators. If the analog input signals applied to converters 810, 812 are considered for reference purposes as zero dB signals, then the signals generated by modules 292, 294 are attenuated by 24 dB.

Input section 210 receives the twenty-four bit words generated by modules 292, 294 and generates therefrom the sum signal that is applied to the sum channel processing section 220. The output signal generated by sum channel processing section 220 is applied to a "times 16 module" (which may be considered as a 24 dB amplifier) 296. Module 296 thereby compensates for the −24 dB attenuators 292, 294 and brings the output of sum channel processing section 220 back to 100% modulation (i.e., back to "full scale"). The output signal generated by module 296 is applied to a sixteen bit digital-to-analog converter 814 which in turn generates an analog conditioned sum signal.

Input section 210 also generates the difference signal that is applied to the difference channel processing section.230. As stated above, as a result of modules 292, 294, the difference signal may be considered as being attenuated by 24 dB. In the DSP embodiment of encoder 200*a*, clipper 254 (shown in FIG. 3) of the difference processing section 230 includes an 18 dB amplifier (which is implemented as a multiply by eight). That is, clipper 254 amplifies the signal generated by fixed preemphasis filter 232*b* by 18 dB and then clips this amplified signal so that the output signal generated by clipper 254 will not exceed a number that is 0.6 dB down from full modulation. The signal applied from clipper 254 to low pass filter 238*b* therefore has one bit (or 6 dB) of "headroom", so filter 238*b* may generate an output signal that is 6 dB greater than its input signal without causing saturation. It is desirable to leave this one bit of headroom because the transient response of filter 238*b* includes some ringing that may cause it to temporarily generate an instantaneous output signal that is greater than its instantaneous input signal and the headroom thereby prevents any ringing in filter 238*b* from causing a saturation condition. Referring again to FIG. 8A, the output signal generated by filter 238*b* is applied to a sixteen bit digital-to-analog converter 816 which in turn generates an output signal that is applied to a 6 dB analog amplifier 820. Both D/A converters 814 and 816 are intended to be complete converters, which include the well-known analog anti-image filters as part of their functionality. Anti-image filters are analog filters applied to the analog signal following digital to analog conversion which serve to attenuate any images of the desired signal which are mirrored about the sample frequency and multiples thereof. Converters 814 and 816 are assumed to be substantially identical to one another, running at the same sample rate and containing substantially the same anti-image filtering. Such converters are commonly available in commercial embodiments, such as the Crystal Semiconductor CS4328. Amplifier 820 amplifies its input signal by 6 dB and thereby brings the encoded difference signal back up to full scale. While FIG. 8A shows encoder 200*a* coupled to analog-to-digital converters 810, 812 for receiving analog audio signals, in digital systems converters 810, 812 may of course be eliminated so that encoder 200*a* receives the digital audio signals directly.

Figure 8B:
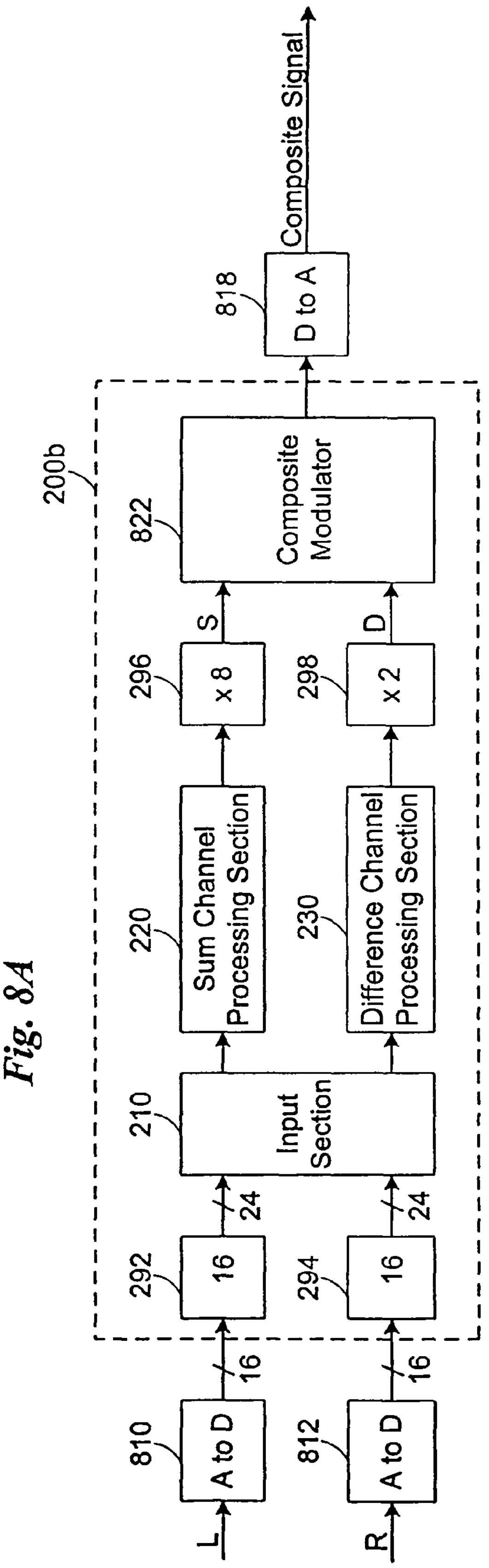

FIG. 8B shows a block diagram of one preferred embodiment of a BTSC encoder 200*b* constructed according to the invention and configured as part of an analog system. Encoder 200*b* is similar to encoder 200*a*, however, in encoder 200*b* module 296 amplifies its input signal by 18 dB (by multiplying by 8) rather than by 24 dB as in encoder 200*a*. The output signal generated by module 296 is a scaled version of the conditioned sum signal and is shown in FIG. 8B as S. Also, encoder 200*b* includes a module 298 for amplifying the output signal generated by difference channel processing section 230 by 6 dB (by multiplying by two). The output signal generated by module 298 is a scaled version of the encoded difference signal and is shown in FIG. 8B as D. Further, encoder 200*b* includes a composite modulator 822 for receiving the signals S and D and for generating therefrom a digital version of the composite signal. The digital composite signal generated by modulator 822 is applied to a digital-to-analog converter 818 the output of which is an analog version of the composite signal. D/A converter 818 is intended to be a complete converter which includes the aforementioned analog anti-image filter as part of its functionality. Such converters are commonly available in commercial embodiments, such as the Burr-Brown PCM1710. In the preferred embodiments, modules 292, 294, input section 210, sum channel processing section 220, difference channel processing section 230, modules 296, 298, and composite modulator 822 are all implemented on a single digital signal processing chip.

Since the composite signal is generated as a digital signal in encoder 200*b*, module 298 is included to bring the output signal generated by difference channel processing section 230 up to full scale rather than waiting until after digital-to-analog conversion and using an analog amplifier such as amplifier 820 as is shown in FIG. 8A. Also, since in the composite signal the conditioned sum signal is used at 50% modulation, module 296 only amplifies its input signal by 18 dB so that the output signal generated by module 296 is at half the amplitude of the output signal generated by module 298.

Figure 9:
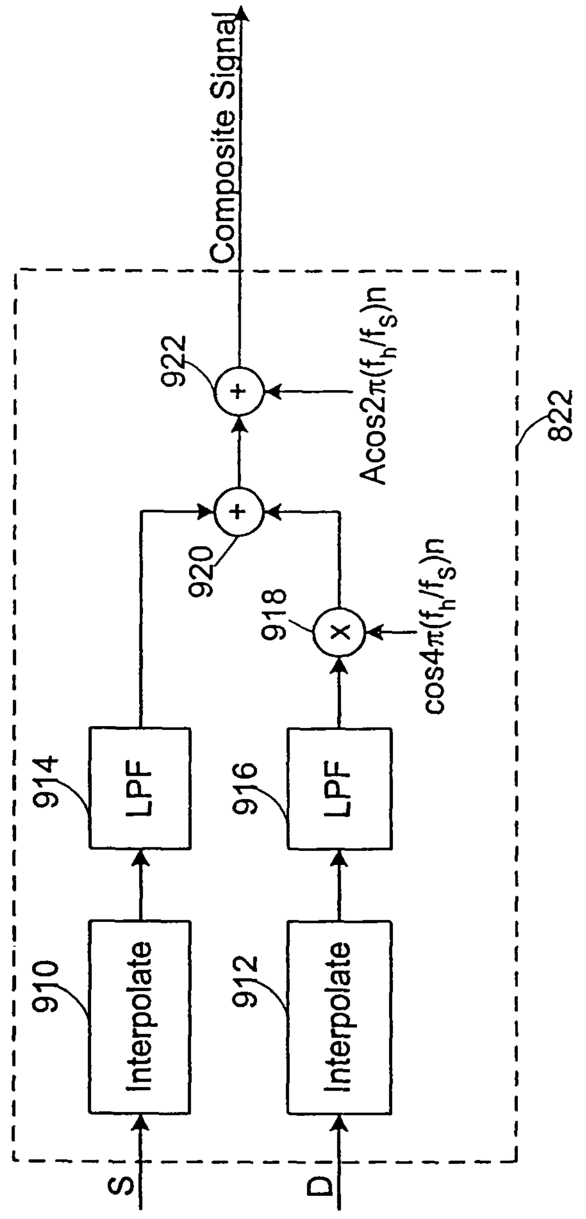
FIG. 9 shows a detailed block diagram of the composite modulator shown in FIGS. 8B-C.

FIG. 9 shows a block diagram of one embodiment of composite modulator 822. The latter receives the signals S and D and generates therefrom a digital version of the composite signal. Modulator 822 includes two interpolators 910, 912, two digital low pass filters 914, 916, a digital signal multiplier 918, and two digital signal adders 920, 922. The S and D signals are applied to respective inputs of the interpolators 910 and 912. Interpolators 910, 912, which are alternatively referred to as "up-samplers", interpolate a new sample between every two consecutive samples applied to their input signals S and D. The output signals generated by interpolators 910 and 912 are applied to respective inputs of low pass filters 914 and 916. The latter remove images introduced into the S and D signals by interpolators 910, 912. The filtered output signal generated by filter 916 is applied to one input of signal multiplier 918 and a digital oscillating signal as a function of cos $[2\pi(f_H/f_s)n]$ is applied to the other input of multiplier 918. Multiplier 918 thereby generates the amplitude modulated, doublesideband, suppressed carrier version of the difference signal that is used in the composite signal. The output signal generated by multiplier 918 is applied to one input of signal adder 920 and the filtered output signal generated by filter 914 is applied to the other input of signal adder 920. The latter generates an output signal by summing the two signals present at its inputs and applies this signal to signal adder 922. A pilot tone signal that oscillates as a function of A cos $[2\pi(f_H/f_s)n]$ (where 'A' is a constant representative of 10% of full scale modulation) is applied to the other input of signal adder 922 which generates the digital composite signal by summing the two signals present at its inputs.

Figure 2:
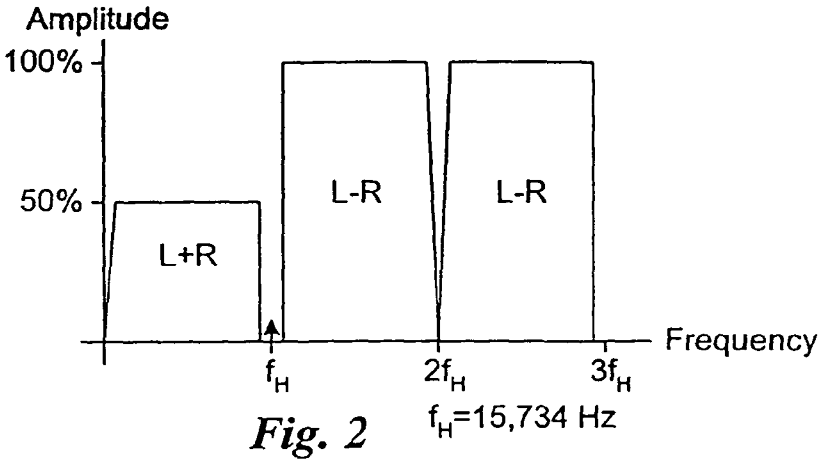
FIG. 2 shows a graph of the spectrum of the composite signal generated in accordance with the BTSC standards.

Composite modulator 822 includes interpolators 910, 912 because the highest frequency component in the composite signal is slightly less than $3f_H$ (as is shown in FIG. 2), and therefore the signals applied to the inputs of signal multiplier 918 and signal adder 920 should have sample rates at least as large as $6f_H$ to satisfy the Nyquist criteria. Because the sample rate at the output of composite modulator 822 is typically higher than the sample rate of either the S or D signals, D/A converter 818 must be capable of operating at such higher sample rates. If the input signals S and D applied to composite modulator 822 have sample rates of $3f_H$ some form of interpolation (such as that provided by interpolators 910, 912) should be provided to double the sample rate. Of course, if sufficiently high sample rates are used throughout encoder 200*b* then interpolators 910, 912 and low pass filters 914, 916 may be eliminated from modulator 822.

Figure 8C:
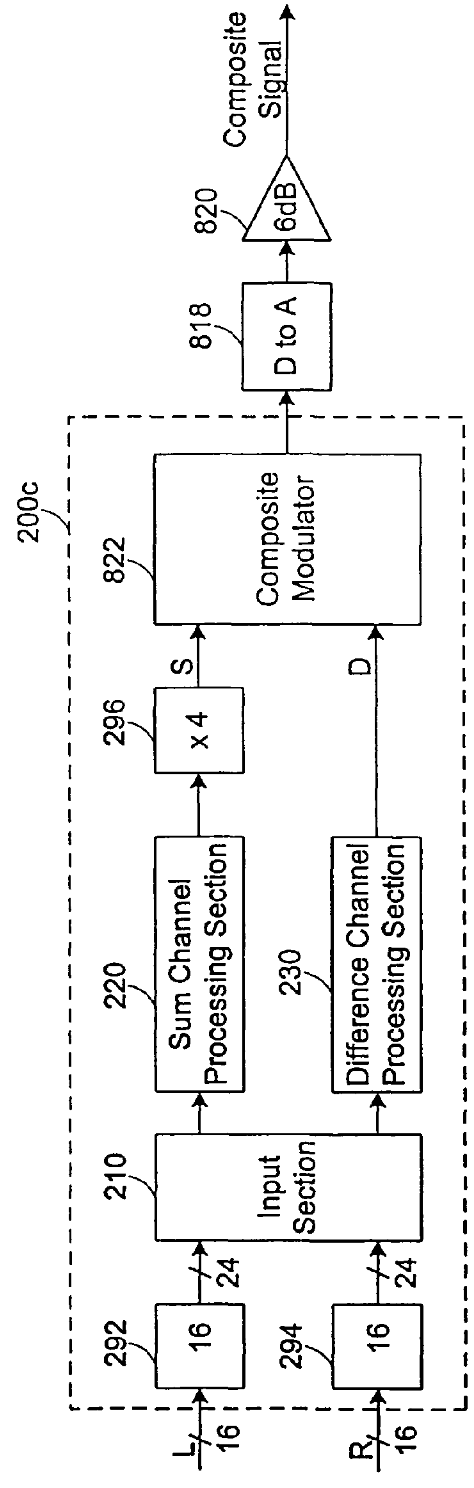

FIG. 8C shows a block diagram of yet another embodiment of a BTSC encoder 200*c* constructed according to the invention. Encoder 200*c* is similar to encoder 200*b* (shown in FIG. 8B) however, in encoder 200*c* module 298 is eliminated so that the signal generated by the difference channel processing section 230 is the signal D and is applied directly to composite modulator 822. Further, in encoder 200*c*, module 296 amplifies its input signal by 12 dB (by multiplying by 4) rather than by 18 dB as is done in encoder 200*b*. So in encoder 200*c*, the signals S and D are 6 dB down from the levels of those signals in encoder 200*b*. Composite modulator 822 therefore generates from these signals a version of the composite signal that is attenuated by 6 dB. This attenuated version of the composite signal is converted to an analog signal by digital-to-analog converter 818 and is then brought up to full scale by 6 dB analog amplifier 820. As with encoder 200*b*, encoder 200*c* is preferably implemented using a single digital signal processing chip.

The differences between encoders 200*b* and 200*c* represent design tradeoffs. As those skilled in the art will appreciate, when converting a digital signal to an analog signal with a digital-to-analog converter, insuring that the digital signal is at full scale tends to minimize any loss of signal-to-noise ratio that might occur as a result of the conversion. Encoder 200*b* minimizes the loss of signal-to-noise ratio as a result of the operation of converter 818 by using modules 296, 298 to insure that the digital version of the composite signal (generated by modulator 822) that is applied to converter 818 is at full scale. However, although converter 200*b* minimizes any loss of signal-to-noise ratio that might occur as a result of converter 818, encoder 200*b* also increases the likelihood that clipping might occur in the composite signal. Since the difference channel processing section 230 uses the relatively large gain provided by fixed preemphasis filter 232 (shown in FIG. 3), it is possible for some clipping to occur in the path of the encoded difference signal. Encoder 200*b* uses module 298 to bring the D signal up to full scale and this essentially eliminates any headroom from the signal path of the D signal and thereby increases the chance that some clipping will occur. So encoder 200*b* minimizes the loss of any signal-to-noise ratio that occurs as a result of converter 818 at the cost of increasing the likelihood of clipping in the path of the encoded difference signal. In contrast, encoder 200*c* preserves headroom in the path of the encoded difference signal and thereby reduces the likelihood of clipping at the cost of increasing the loss of signal-to-noise ratio that occurs as a result of operation of converter 818.

Figure 8D:
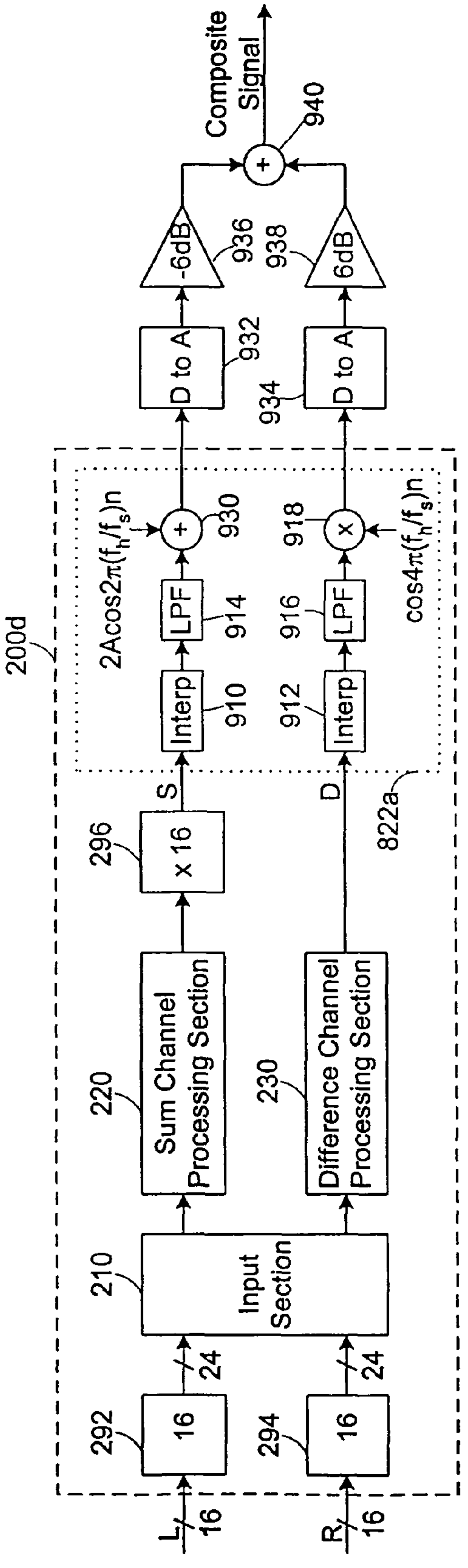

FIG. 8D shows a block diagram of yet another embodiment of a BTSC encoder 200*d* constructed according to the invention. Encoder 200*d* is similar to encoder 200*a* (shown in FIG. 8A) however, encoder 200*d* additionally includes a portion 822*a* of a composite modulator. Portion 822*a* includes two interpolators 910, 912, two low pass filters 914, 916, digital signal multiplier 918 and a digital signal adder 930. The S signal generated by module 296 is applied to interpolator 910 which "up-samples" the S signal and applies the up-sampled signal to low pass filter 914. The latter filters this signal and applies the filtered signal to one input terminal of adder 930. A digital pilot tone having twice the normal amplitude (i.e., 2A cos $2\pi(f_H/f_s)n$) is applied to the other input terminal of adder 930 which generates an output signal by summing the two signals present at its input terminals. The D signal generated by difference channel processing section 230 is applied to interpolator 912 which generates an up-sampled signal that is applied to low pass filter 916. The latter filters this signal and applies the filtered signal to one terminal of multiplier 918. A signal oscillating according to cos $4\pi(f_H/f_s)n$ is applied to the other terminal of multiplier 918 which generates an output signal by multiplying the two signals present at its input terminals. As with encoders 200*a-c*, encoder 200*d* is preferably implemented using a single digital signal processing chip.

Encoder 200*d* is preferably used in conjunction with two digital-to-analog converters 932, 934, an analog −6 dB attenuator 936, an analog 6 dB amplifier 938, and an analog adder 940. The output signal generated by adder 930 is applied to converter 932 which generates an analog signal that is applied to attenuator 936. The output signal generated by multiplier 918 is applied to converter 934 which generates an analog signal that is applied to amplifier 938. The signals generated by attenuator 936 and amplifier 938 are applied to input terminals of signal adder 940 which sums these signals to generate the analog composite signal. D/A converters 932 and 934 are intended to be complete converters which include the aforementioned analog anti-image filters as part of their functionality. Converters 932 and 934 are assumed to be substantially identical to one another, running at the same sample rate and containing substantially the same anti-image filtering. Such converters are commonly available in commercial embodiments, such as the Burr Brown PCM1710.

It is also possible to eliminate interpolator 910 and low pass filter 914 from FIG. 8D, and run D/A converter 932 at a sample rate equal to that of the sum channel processing section 220. However, to do so is generally not practical because inexpensive, commonly available D/A converters are usually available in pairs housed within a single integrated circuit. Such paired D/A converters naturally operate at the same sample rate. While it is possible to reduce DSP complexity by eliminating interpolator 910 and low pass filter 914 from FIG. 8D, doing so would also likely increase the cost and complexity of the overall design because a simple stereo D/A converter could no longer be used for both D/A converters 932 and 934.

Encoder 200*d* represents one combination of the features of encoders 200*b* and 200*c*. Encoder 200*d* uses module 296 to bring the S signal up to full scale so as to minimize any loss of signal-to-noise ratio that might occur as a result of the operation of converter 932. Encoder 200*d* also preserves 6 dB of headroom in the signal path of the D signal and therefore reduces the likelihood of any loss of accuracy due to clipping. Although encoder 200*d* includes more components than either of encoders 200*b* and 200*c*, encoder 200*d* both minimizes loss of signal-to-noise ratio and the likelihood of clipping.

Figure 10:
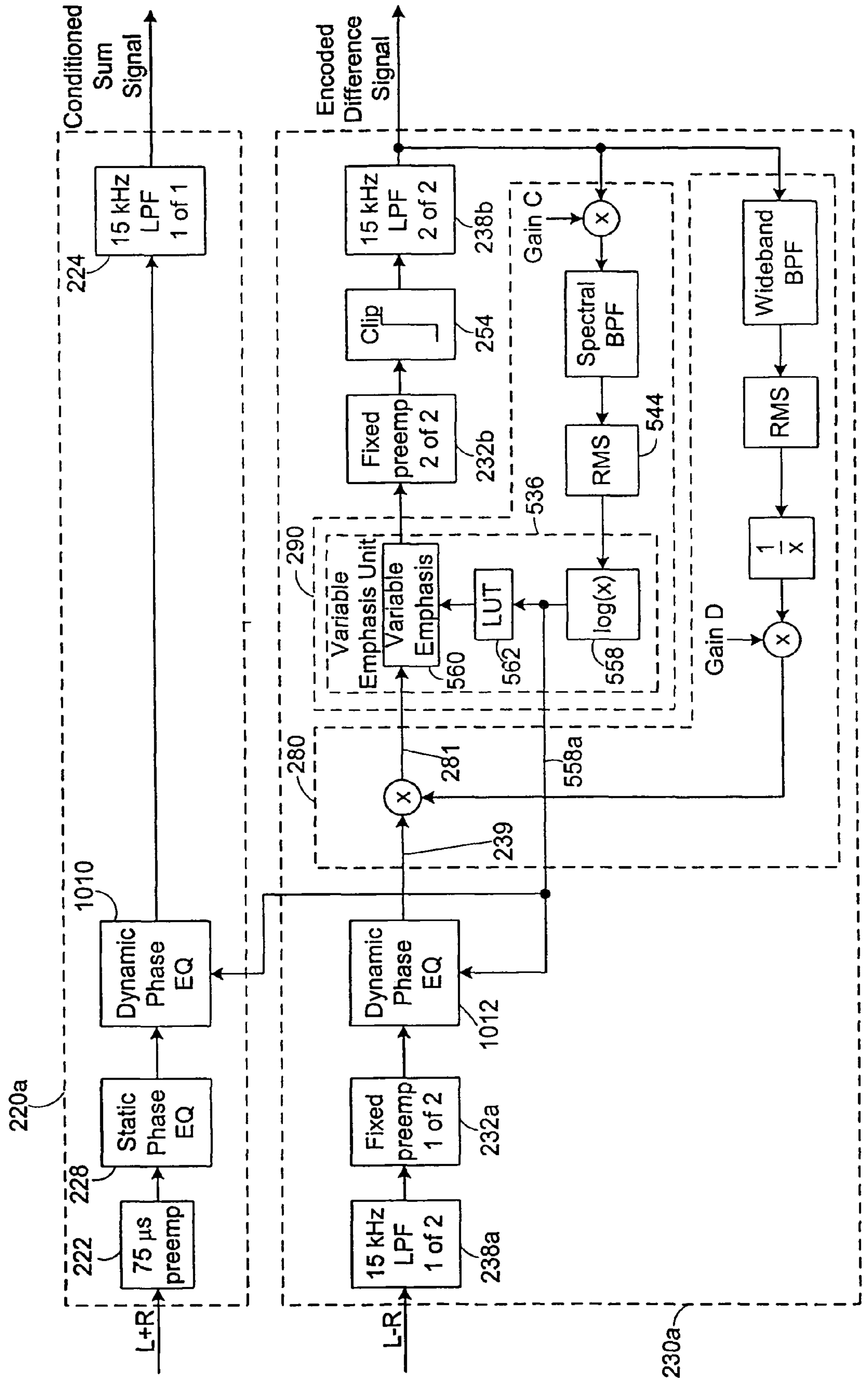
FIG. 10 shows a block diagram of one preferred embodiment of sum and difference channel processing sections that may be used in digital BTSC encoders constructed according to the invention.

FIG. 10 shows a block diagram of a preferred embodiment of sum channel processing section 220*a* and difference channel processing section 230*a* for use in encoder 200 (and these sections 220*a*, 230*a* may of course be used in encoders 200*a-d*). Processing sections 220*a*, 230*a* are similar to the above-described sections 220, 230, however, section 220*a* additionally includes dynamic phase equalization filter 1010, and section 230*a* additionally includes a dynamic phase equalization filter 1012. In the illustrated embodiment, the output signals generated by static phase equalization filter 228 and fixed preemphasis filter 232*a* are applied to the input terminals of dynamic phase equalization filters 1010 and 1012, respectively, and the output signal generated by logarithmic generator 558 on line 558*a* is applied to the control terminals of filters 1010, 1012. The output signals generated by filters 1010 and 1012 are applied to low pass filter 224 and to wideband compression unit 280, respectively.

Dynamic phase equalization filters 1010, 1012 are used to compensate for phase errors introduced by variable emphasis filter 560 which is used in spectral compression unit 290. The phase response of variable emphasis filter 560 is preferably matched as closely as is possible to that of variable emphasis filter 136 (shown in FIG. 1). However, due to the variable, signal dependent, nature of variable emphasis filter 136, it is extremely difficult to design variable emphasis filter 560 so that its phase response is matched to that of variable emphasis filter 136 for all pre-emphasis/de-emphasis characteristics, which in turn varies with signal level. Therefore in typical embodiments of encoder 200, the phase responses of variable emphasis filter 560 and variable emphasis filter 136 diverge as a function of the signal level. Dynamic phase equalization filters 1010, 1012 preferably introduce compensatory phase errors into the sum and difference channel processing sections to compensate for the divergence between variable emphasis filter 560 and variable emphasis filter 136.

Dynamic phase equalization filters 1010, 1012 therefore perform a function that is similar to that performed by static phase equalization filter 228. However, whereas filter 228 compensates for phase errors that are independent of the level of the encoded difference signal, filters 1010, 1012 compensate for phase errors that are dependent on this signal level. Filters 1010, 1012 are preferably implemented as "all pass" filters having relatively flat magnitude responses and selected phase responses. Dynamic phase equalization filters are included in both the sum and difference processing sections because a phase delay may be required in either the sum or difference channel to compensate for the phase error introduced by variable emphasis filter 560. In preferred embodiments, filters 1010, 1012 are implemented in a similar fashion as variable emphasis unit 536 and include a filter having a variable coefficient transfer function and a LUT for selecting the values of the filter coefficients during any particular interval. The signal generated by logarithmic generator 558 on line 558*a* is preferably applied to the control terminals of filters 1010, 1012 and selects the filter coefficients used by those filters.

Digital encoder 200 has been discussed in connection with certain particular embodiments, however, those skilled in the art will appreciate that variations of these embodiments are also embraced within the invention. For example, variable emphasis unit 536 (shown in FIG. 6) has been discussed in terms of being implemented using a variable emphasis filter 560 and a LUT 562. However, rather than precomputing all the possible coefficients for filter 560 and storing them in LUT 562, it may be preferable for other implementations of variable emphasis unit 536 to eliminate LUT 562 and to instead include components for calculating the filter coefficients in real time. Those skilled in the art will appreciate that such considerations represent a tradeoff between memory resources (such as are used by a LUT for storing filter coefficients) and computing resources (such as are used by components for calculating filter coefficients in real time) and may be resolved differently in any particular implementation of encoder 200. Similar considerations apply to square root devices 456 and 556, reciprocal generator 458, and logarithmic generator 558 (shown in FIGS. 5 and 6) which may alternatively use memory resources (e.g., a LUT for storing all the values) or processing resources (e.g., for calculating a Taylor series polynomial approximation). In yet other embodiments, any or all of the components in encoder 200 may be implemented using individual hardware components or alternatively as software modules running on a general or specific purpose computer.

Another example of variations of encoder 200 that are embraced within the invention relates to scaling modules 292, 294 (shown in FIG. 8B). These modules are particularly relevant to fixed point implementations of encoder 200. In floating point implementations there is no need to pad each sample with zeros and sign bits to prevent overflow and these modules can therefore be eliminated from floating point implementations. As a further example, the static phase equalization filter 228 (shown in FIG. 10) has been discussed in terms of compensating for phase errors introduced by filter 232*a*, however, filter 228 may be alternatively used to compensate for other phase errors introduced by other components in the difference channel processing section 230*a*. Still further, filters 228 and 1010 may be implemented as a single filter.

Therefore, since certain changes may be made in the above apparatus without departing from the scope of the invention herein involved, it is intended that all matter contained in the above description or shown in the accompanying drawing shall be interpreted in an illustrative and not a limiting sense.

What is claimed is:

1. A system for producing a digital composite modulated BTSC signal compliant with the BTSC standard, the system comprising:

(A) a digital BTSC encoder operative to generate digital sum and difference signal components that are BTSC-compliant, wherein the digital BTSC encoder includes, (i) a sum channel processing section operative to process a digital sum signal and produce a digital conditioned sum signal according to the BTSC standard; and (ii) a difference channel processing section including a compression unit with a gain control feedback line, the difference channel processing section operative to encode a digital difference signal and produce a digital encoded difference signal according to the BTSC standard, wherein the digital difference signal represents the difference between left (L) and right (R) audio signals in left and right channels, respectively, wherein the difference channel processing section comprises a clipper;

(iii) a lowpass filter operative to receive the digital difference signal and to produce an attenuation of signal energy above 15 kHz in the digital difference signal, and wherein the attenuation reduces instability in the gain control feedback line and the digital encoded difference signal, for avoiding audible artifacts and/or improving left (L) and right (R) channel separation upon decoding of the digital composite modulated BTSC encoded signal, and wherein the lowpass filter comprises first and second sections disposed in the difference channel processing section, and wherein the first section of the lowpass filter is disposed in the difference channel processing section before the compression unit and the clipper, and wherein the second section of the lowpass filter is disposed in the difference channel processing section after the compression unit and the clipper and before the feedback line of the compression unit;

wherein the digital BTSC encoder has a digital domain magnitude response and digital domain inter-channel phase difference that are substantially equal to the analog domain magnitude response specified by the BTSC standard and analog domain inter-channel phase difference specified by the BTSC standard, respectively; and (B) a digital composite modulator operative to receive the digital encoded difference signal and the digital conditioned sum signal and to produce the digital composite modulated BTSC signal.

2. The system of claim 1, wherein the left channel comprises a left digital audio channel, wherein the right channel comprises a right digital audio channel, and wherein the first section of the low pass filter includes a first portion disposed in the left digital audio channel and a second portion disposed in the right digital audio channel.

3. The system of claim 1, wherein the errors between the digital domain magnitude response of the digital BTSC encoder and the analog domain magnitude response specified by the BTSC standard, and between the digital domain inter-channel phase difference of the digital BTSC encoder and the analog domain inter-channel phase difference specified by the BTSC standard, are small enough to allow stereo separation upon decoding, from 100 Hz to 8 kHz, no worse than 10 dB less than that required by the BTSC broadcast standard.

4. A system for producing a digital composite modulated BTSC signal compliant with the BTSC standard, the system comprising:

(A) a digital BTSC encoder operative to generate digital sum and difference signal components that are BTSC-compliant, wherein the digital BTSC encoder includes, (i) a sum channel processing section operative to process a digital sum signal and produce a digital conditioned sum signal according to the BTSC standard; and (ii) a difference channel processing section including a compression unit with a gain control feedback line, the difference channel processing section operative to encode a digital difference signal and produce a digital encoded difference signal according to the BTSC standard, wherein the digital difference signal represents the difference between left (L) and right (R) audio signals in left and right channels, respectively, wherein the difference channel processing section comprises a clipper;

(iii) lowpass filter means operative to receive the digital difference signal and to produce an attenuation of signal energy above 15 kHz in the digital difference signal, and wherein the attenuation reduces instability in the gain control feedback line and the digital encoded difference signal, for avoiding audible artifacts and/or improving left (L) and right (R) channel separation upon decoding of the digital composite modulated BTSC encoded signal, and wherein the lowpass filter means comprises first and second sections disposed in the difference channel processing section, and wherein the first section of the lowpass filter means is disposed in the difference channel processing section before the compression unit and the clipper, and wherein the second section of the lowpass filter means is disposed in the difference channel processing section after the compression unit and the clipper and before the feedback line of the compression unit;

wherein the digital BTSC encoder has a digital domain magnitude response and digital domain inter-channel phase difference that are substantially equal to the analog domain magnitude response specified by the BTSC standard and analog domain inter-channel phase difference specified by the BTSC standard, respectively; and (B) a digital composite modulator operative to receive the digital encoded difference signal and the digital conditioned sum signal and to produce the digital composite modulated BTSC signal.

5. The system of claim 4, wherein the left channel comprises a left digital audio channel, wherein the right channel comprises a right digital audio channel, and wherein the first section of the low pass filter means includes a first portion disposed in the left digital audio channel and a second portion disposed in the right digital audio channel.

6. The system of claim 4, wherein the errors between the digital domain magnitude response of the digital BTSC encoder and the analog domain magnitude response specified by the BTSC standard, and between the digital domain inter-channel phase difference of the digital BTSC encoder and the analog domain inter-channel phase difference specified by the BTSC standard, are small enough to allow stereo separation upon decoding, from 100 Hz to 8 kHz, no worse than 10 dB less than that required by the BTSC broadcast standard.

7. A computer-executable program product for producing a digital composite modulated BTSC signal compliant with the BTSC standard, the computer-executable program product comprising a non-transitory computer-readable medium with resident computer-readable instructions, the computer-readable instructions comprising instructions for:

(i) processing a digital sum signal and producing a digital conditioned sum signal according to the BTSC standard;

(ii) encoding a digital difference signal and producing a digital encoded difference signal according to the BTSC standard, wherein the digital difference signal represents the difference between left (L) and right (R) audio signals in left and right channels, respectively, wherein encoding includes compressing and providing gain control by a feedback line in accordance with the BTSC standard;

(iii) receiving the digital difference signal, and with a low pass filter producing an attenuation of signal energy above 15 kHz in the digital difference signal, and wherein the attenuation reduces instability in the gain control feedback line and the digital encoded difference signal, for avoiding audible artifacts and/or improving left (L) and right (R) channel separation upon decoding of the digital composite modulated BTSC encoded signal, and wherein the instructions for producing the attenuation of signal energy above 15 kHz cause the attenuation to occur with the low pass filter disposed in a difference channel processing section of a digital BTSC encoder, wherein the lowpass filter comprises first and second sections disposed in the difference channel processing section, wherein the difference channel processing section comprises a compression unit and a clipper, and wherein the instructions for producing the attenuation of signal energy above 15 kHz cause the attenuation to occur with the first section of the lowpass filter disposed in the difference channel processing section before the compression unit and the clipper, and also with the second section of the lowpass filter disposed in the difference channel processing section after the compression unit and the clipper and before the feedback line of the compression unit;

wherein the digital domain inter-channel magnitude difference between the digital encoded difference signal and the digital conditioned sum signal is substantially equal to the analog domain inter-channel magnitude difference specified by the BTSC standard, and wherein the digital domain inter-channel phase difference between the digital encoded difference signal and the digital conditioned sum signal is substantially equal to the analog domain inter-channel phase difference specified by the BTSC standard.

8. The computer-executable program product of claim 7, wherein the instructions further comprise instructions for receiving the digital encoded difference signal and the digital conditioned sum signal and modulating them together to produce the digital composite modulated BTSC signal.

9. The computer-executable program product of claim 7, wherein the left channel comprises a left digital audio channel, wherein the right channel comprises a right digital audio channel, and wherein the instructions for producing the attenuation of signal energy above 15 kHz cause the attenuation to occur in a first portion of the first section of the low pass filter disposed in the left digital audio channel and in a second portion of the first section of the low pass filter disposed in the right digital audio channel.

10. The computer-executable program product of claim 7, wherein the wherein the instructions provide that the errors between the digital domain magnitude response of a digital BTSC encoder and the analog domain magnitude response specified by the BTSC standard, and between the digital domain inter-channel phase difference of the digital BTSC encoder and the analog domain inter-channel phase difference specified by the BTSC standard, are small enough to allow stereo separation upon decoding, from 100 Hz to 8 kHz, no worse than 10 dB less than that required by the BTSC broadcast standard.

* * * * *